United States Patent
Yamamoto et al.

(10) Patent No.: US 6,246,618 B1
(45) Date of Patent: Jun. 12, 2001

(54) SEMICONDUCTOR INTEGRATED CIRCUIT CAPABLE OF TESTING AND SUBSTITUTING DEFECTIVE MEMORIES AND METHOD THEREOF

(75) Inventors: Seiji Yamamoto; Koji Goto; Yasushi Okamoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/705,785

(22) Filed: Nov. 6, 2000

(30) Foreign Application Priority Data

Jun. 30, 2000 (JP) ................................. 12-199859

(51) Int. Cl.[7] ................................. G11C 29/00
(52) U.S. Cl. ................ 365/200; 365/201; 365/225.7; 365/230.03; 365/233; 365/189.02; 365/51; 714/710; 714/718
(58) Field of Search .................... 365/201, 200, 365/230.03, 225.7, 189.02, 233, 51; 714/710, 711, 720, 719, 718

(56) References Cited

U.S. PATENT DOCUMENTS

| | | | |
|---|---|---|---|
| 5,060,197 | * 10/1991 | Park et al. | 365/200 |
| 5,561,622 | * 10/1996 | Bertin et al. | 365/51 |
| 5,802,070 | * 9/1998 | Adams et al. | 714/718 |
| 5,892,721 | * 4/1999 | Kim | 365/201 |

FOREIGN PATENT DOCUMENTS

| | | | |
|---|---|---|---|
| 4111300 | * 4/1992 | (JP) | G11C/17/00 |
| 6131899 | * 5/1994 | (JP) | G11C/29/00 |
| 10-241399 | 9/1998 | (JP) | G11C/29/00 |
| 11-176187 | 7/1999 | (JP) | G11C/29/00 |

OTHER PUBLICATIONS

G. W. Kurtz et al., "Memory With Error Correction", IBM Technical Disclosure Bulletin, vol. 13, No. 1, Jun. 1970, pp. 135–136.*

* cited by examiner

Primary Examiner—Andrew Q. Tran
(74) Attorney, Agent, or Firm—Leydig, Voit & Mayer, Ltd.

(57) ABSTRACT

A semiconductor integrated circuit comprises many RAMs, a supplementary RAM, and test/repair control logic which detects a defective RAM out of the multiple RAMs. If a defective RAM is detected, selectors supplement such a defective RAM with the supplementary RAM.

18 Claims, 18 Drawing Sheets

SEMICONDUCTOR INTEGRATED CIRCUIT CAPABLE OF TESTING AND SUBSTITUTING DEFECTIVE MEMORIES AND METHOD THEREOF

FIELD OF THE INVENTION

The present invention relates to a semiconductor integrated circuit comprising many memories, a memory repair method for a semiconductor integrated circuit, and a computer product. In particular, this invention relates to the semiconductor integrated circuit for improving yield, a memory repair method for the semiconductor integrated circuit, and a computer product.

BACKGROUND OF THE INVENTION

In recent years, semiconductor integrated circuits have been made highly integrated and large-scale. Furthermore, the semiconductor integrated circuit now comprises a large number of memories. FIG. 18 shows the constitution of a conventional semiconductor integrated circuit. This conventional semiconductor integrated circuit (LSI) 200 comprises many memories 201 such as RAMs and a test logic and design block 202. The test logic is a circuit which executes a test to detect defective memories among the RAMs 201. The design block is a circuit which uses the RAMs 201 to achieve the functions of the LSI 200.

However, if a memory mounted on the conventional LSI becomes defective, it can not be repaired. That is, if even one memory becomes defective, the entire semiconductor integrated circuit is discarded. Consequently, the yield is poor. In particular, the greater the number of memories mounted in the semiconductor integrated circuit, the greater the probability that one of the memories of the semiconductor integrated circuit will be defective, making the yield even worse.

SUMMARY OF THE INVENTION

It is an object of this invention to provide a semiconductor integrated circuit in which yield can be increased and a method for repairing memories in the semiconductor integrated circuit.

The semiconductor integrated circuit according to one aspect of the present invention has following structure. That is, it comprises many memories; a supplementary memory; a first testing unit which performs a test to detect a defective memory among the many memories; and a supplement control unit which provides the supplementary memory in correspondence with a detected defective memory among the many memories based on a supplement control signal in accordance with the result of the test performed by the first testing unit.

According to the above invention, the first testing unit performs a test to detect a defective memory among the many memories and the supplement control unit provides the supplementary memory in correspondence with a detected defective memory among the many memories based on a supplement control signal in accordance with the result of the test performed by the first testing unit. As a consequence, the entire semiconductor integrated circuit can function regularly even when one of the memories is defective.

Further, the memories are set in a shift order, the supplementary memory being set in a last stage of the shift order. The supplement control unit carries out a shift from a subsequent stage of the detected defective memory up to the supplementary memory, thereby supplementing the detected defective memory.

According to the above invention, the supplement control unit carries out a shift from a subsequent stage of the detected defective memory up to the supplementary memory, thereby supplementing the detected defective memory. Therefore, skews between the memories can be reduced.

Further, the memories are provided continuously and in correspondence with the shift order of the supplement control unit.

According to the above invention, the memories are provided continuously and in correspondence with the shift order of the supplement control unit. Therefore, skews between the memories can be reduced.

Further, the first testing unit comprises a self-test control unit which controls the memories so that they perform simultaneously self-tests.

According to the above invention, the self-test control unit controls the memories so that they perform simultaneously self-tests. Therefore, the semiconductor integrated circuit can simultaneously test the memories by itself.

Further, a second testing unit which performs a test to detect defective detection in the first testing unit is provided.

According to the above invention, the second testing unit performs a test to detect defective detection in the first testing unit. Therefore, the reliability of the test performed by the first testing unit can be increased.

Further, a multiplying unit which multiplies a clock signal for test of the first testing unit to a predetermined frequency is provided. The first testing unit tests the actual operation and/or the speed operation margin by using the clock signal which has been multiplied by the multiplying unit.

According to the above invention, the multiplying unit multiplies a clock signal for test of the first testing unit to a predetermined frequency, and the first testing unit tests the actual operation and/or the speed operation margin by using the clock signal which has been multiplied by the multiplying unit. Therefore, a more detailed test can be carried out.

Further, a supplement control signal creating unit which automatically creates a supplement control signal based on a test result of the first testing unit is provided.

According to the above invention, the supplement control signal creating unit automatically creates a supplement control signal based on a test result of the first testing unit. Therefore, the supplement control signal can be automatically created in the semiconductor integrated circuit.

Further, the memories are different types and the first testing unit is provided commonly for the different types of memories.

According to the above invention, the first testing unit is provided commonly for different types of memories. Therefore, an increase in the circuit area can be prevented.

Further, the supplement control unit is distributed across the memories.

According to the above invention, the supplement control unit is distributed across the memories. Therefore, skews between the memories can be reduced. Furthermore, the constitution can easily be designed so as to increase memory accessing speed, and reduce the delay of signals for actual operation so as to give them priority over signals for test.

Further, a memory using circuit which uses the memories is provided, and the supplementary memory is provided on a side close to the memory using circuit.

According to the above invention, the supplementary memory is provided on a side close to the memory using circuit. Therefore, the timing deviates in an optimal direction when a memory is replaced.

Further, the memories are separately arranged in many groups and the supplementary memory is provided for each group.

According to the above invention, a supplementary memory is provided for each of the many memory groups. Therefore, memories in each group can be repaired even when the memories are separately arranged in many groups.

Further, the memories are separately arranged in many groups, and the supplementary memory is provided commonly for all or some of the memory groups.

According to the above invention, the supplementary memory is provided commonly for the memory groups. Therefore, it is possible to prevent the circuit area from increasing.

The memory repair method of a semiconductor integrated circuit comprising many memories and a supplementary memory according to another aspect of the present invention comprises following steps. That is, the step of performing a first test to detect a defective memory among the many memories; and the step of supplementing the supplementary memory in correspondence with the detected defective memory among the memories based on a supplement control signal which is in accordance with a result of the test performed in the first testing step.

According to the above invention, a first testing step performs a test to detect defects among memories, and the supplement control step provides a supplementary memory in correspondence with the detected defective memory among the memories based on a supplement control signal which is in accordance with the result of the test performed by the first testing step. Consequently, the entire semiconductor integrated circuit can function regularly even when any one of the memories is defective.

Further, the memories are set in a shift order, the supplementary memory being set in a last stage of the shift order. The supplement control step carries out a shift from a subsequent stage of the detected defective memory up to the supplementary memory, thereby supplementing the detected defective memory.

According to the above invention, in the supplement control step the memories are shifted from the stage after the detected defective memory up to the supplementary memory, whereby the detected defective memory is supplemented. Therefore, skews between the memories can be reduced.

Further, a step of controlling the memories to perform simultaneous self-tests at the first testing step is provided.

According to the above invention, the memories are controlled so as to perform simultaneous self-tests at the first testing step. Therefore, the semiconductor integrated circuit can simultaneously test the memories by itself.

Further, a second testing step of performing a test to detect defective detection in the first testing step is provided.

According to the above invention, in the second testing step, a test is performed to detect defective detection in the first testing step. Therefore, the reliability of the test performed by the first testing step can be increased.

Further, the first testing step comprises multiplying a clock signal for test to a predetermined frequency, and testing the actual operation and/or the speed operation margin.

According to the above invention, the first testing step comprises multiplying a clock signal for test to a predetermined frequency, and testing the actual operation and/or the speed operation margin. Therefore, a more detailed test can be carried out.

A computer product according to still another aspect of the present invention comprises a computer-readable recording medium which programs for allowing a computer to execute the memory repair method of a semiconductor integrated circuit according to the invention as described above are stored in. Therefore, the operations and methods of the invention described above can be realized by a computer.

Here, "computer-readable recording medium" includes "transportable recording media" such as a magnetic disk such as a floppy disk, a semiconductor memory (including those contained in a cartridge, a PC card, etc.) such as a ROM, an EPROM, an EEPROM, a flash ROM and the like, an optical disk such as a CD-ROM and a DVD, an optical magnetic disk such as an MO, and "physical media for securing" such as a ROM, a RAM, and hardware which are contained in various types of computer systems.

Moreover, "computer-readable recording medium" may also include communications media which hold programs for a short time, such as communications wires in a case where programs are transmitted via a network such as the Internet, LAN, WAN, etc. "Program" denotes a data processing method, there being no particular restrictions on the terms and methods described subsequently and no limit on the format, such as the source code, the binary code, the manner of execution, etc. "Program" is not necessarily restricted to a single configuration, and may be distributed across multiple modules and libraries or may function in cooperation with another individual program such as an OS.

Other objects and features of this invention will become apparent from the following description with reference to the accompanying drawings.

DESCRIPTION OF THE PREFERRED EMBODIMENTS

Preferred embodiments of the present invention will be explained with reference to the drawings. This invention is not limited to these embodiments.

Figure 1:
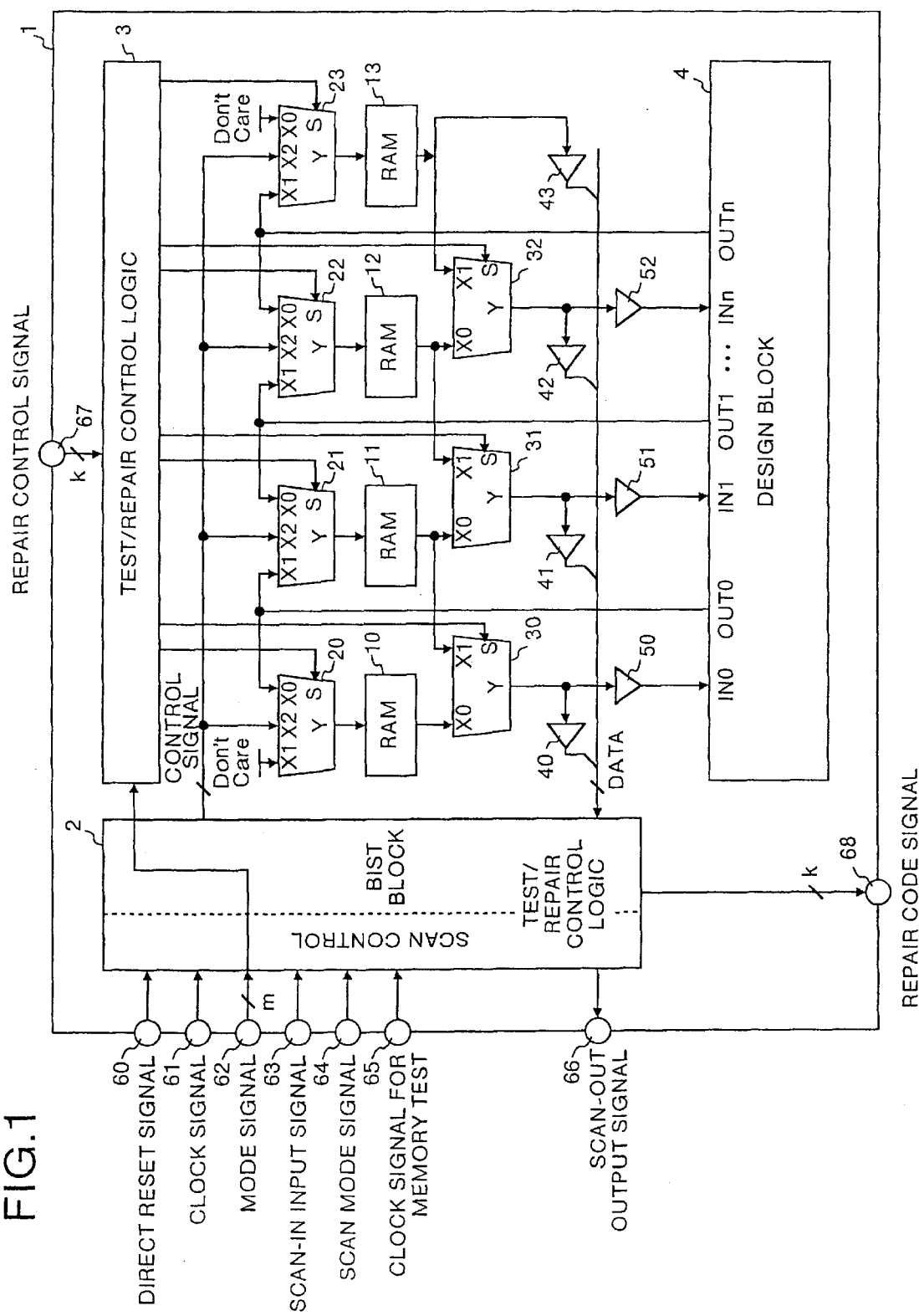
FIG. 1 is a diagram showing the constitution of a semiconductor integrated circuit according to a first embodiment of the present invention.

FIG. 1 is a diagram which shows the constitution of a semiconductor integrated circuit according to a first embodiment of this invention. The semiconductor integrated circuit (there are no particular restrictions on the scale e.g. an LSI) 1 of the first embodiment comprises many memories (e.g. RAMs) 10, 11 and 12, a memory for assistance or replacement (e.g. a RAM) 13, memory input side selectors 20, 21, 22 and 23 which switch signals (data and control signals) to the RAMs 10 to 13, memory output side selectors 30, 31 and 32 which switch RAM data output signals from the RAMs 10 to 13, and a memory test circuit (test/repair control logic) 2. The test/repair control logic 2 comprises (a) a scan controller which scan tests the RAMs 10 to 13, and (b) a BIST block which carries out a BIST (built-in self test) of the RAMs 10 to 13.

The LSI 1 comprises a memory test circuit (test/repair control logic) 3 which controls the selectors 20 to 23 and 30 to 32 in accordance with a mode signal and a repair signal, a circuit block (design block) 4 which achieves the functions of the LSI 1 by using the RAMs 10 to 13 during actual operation, memory test circuit side output buffers 40 to 43 which output the RAM data output signals from the RAMs 10 to 13 to the test/repair control logic 2, and circuit block side output buffers 50 to 52 which output the RAM data output signals from the RAMs 10 to 13 to the design block 4.

The type of memory used for the RAMs 10 to 13 is not limited to DRAM, SRAM. Further, a single type of memory may be used or a mixture of different types of memories may be used. Although only one RAM for assistance 13 is shown, many of them may be provided. The memory input side selectors 20 to 23 output the control signals (signals for testing which include data and control signals) from the test/repair control logic 2 or signals (data and control signals) from the design block 4 to the RAMs 10 to 13 in accordance with the selector selection signal from the test/repair control logic 3. That is, the memory input side selectors 20 to 23 switch between signals for testing and signals for actual operation.

The memory input side selectors 20 to 23 are arranged in a row in correspondence with the RAMs 10 to 13. In accordance with the selector selection signals from the test/repair control logic 3, the signal from the design block 4 which is usually extracted and output by one of the selectors is replaced by the signal from the design block 4 which is usually extracted and output by an adjacent memory input side selector. The memory output side selectors 30 to 32 are arranged in a row in correspondence with the RAMs 10 to 12. In accordance with the selector selection signals from the test/repair control logic 3, the signal from the RAM which is usually extracted and output by one of the selectors is replaced by the signal from the RAM which is usually extracted and output by an adjacent memory input side selector.

That is, (the connections of) the RAMs 10 to 13 can be shifted and replaced by switching the selectors 20 to 23 and 30 to 32. FIG. 1 shows an example in which one RAM section can be shifted. However, if the selector input is increased, it is possible to shift many RAMs at one time. Alternatively, the RAMs 10 to 12 and the RAM for assistance 13 can be connected so as to be directly replaceable without shifting the RAMs 10 to 13. However, the interconnections can be simplified by connecting the RAMs 10 to 13 so that they can be replaced by shifting.

The test/repair control logic 2 extracts (a) a direct reset signal via a reset input terminal 60, (b) clock signals for scan testing and BIST testing via a clock input terminal 61, (c) a mode signal (a signal which selects a RAM to execute ordinary mode, BIST mode, or a scan test) via a mode input terminal 62, (d) a scan data input signal via a scan-in input terminal 63, (e) a scan mode signal (a signal which sets the scan mode) via a scan mode input terminal 64, and (f) a clock signal for memory test via a memory clock input terminal 65. The test/repair control logic 2 creates control signals based on these signals and outputs the control signals to the memory input side selectors 20 to 23.

The test/repair control logic 2 extracts data from the memory test circuit side output buffers 40 to 43, outputs scan data output signals via a scan-out output terminal 66 when a scan test is carried out, and outputs repair code signals via a repair code output terminal 68 when carrying out a BIST test.

The test/repair control logic 3 extracts the mode signals, extracts the repair control signals via a repair control input terminal 67, and output selector selection signals to the selectors 20 to 23 and 30 to 32. In the example under consideration, the selector selection signals comprise signals for controlling which input is selected and output by the selectors 20 to 23 and 30 to 32, and the repair control signals comprise signals for controlling processing which supplements a defective RAM with the RAM for assistance 13.

When the mode signal is a mode for carrying out a test (i.e. the scan mode or the BIST mode), the test/repair control logic 3 outputs selector selection signals so that the memory input side selectors 20 to 23 select the control signals from the test/repair control logic 3 and the memory output side selectors 30 to 32 select the ordinary input.

When the mode signal is the ordinary mode for carrying out ordinary operations, the test/repair control logic 3 outputs the selector selection signals which cut off a defective RAM and replace it by shifting one or many RAMs from the defective RAM to the RAM 13 based on the repair control signal. The memory test circuit side output buffers 40 to 43 output the RAM data output signals from the RAMs 10 to 13 to the test/repair control logic 2. The circuit block side buffers 50 to 52 output the RAM data output signals from the RAMs 10 to 13 to the design block 4.

Figure 2:
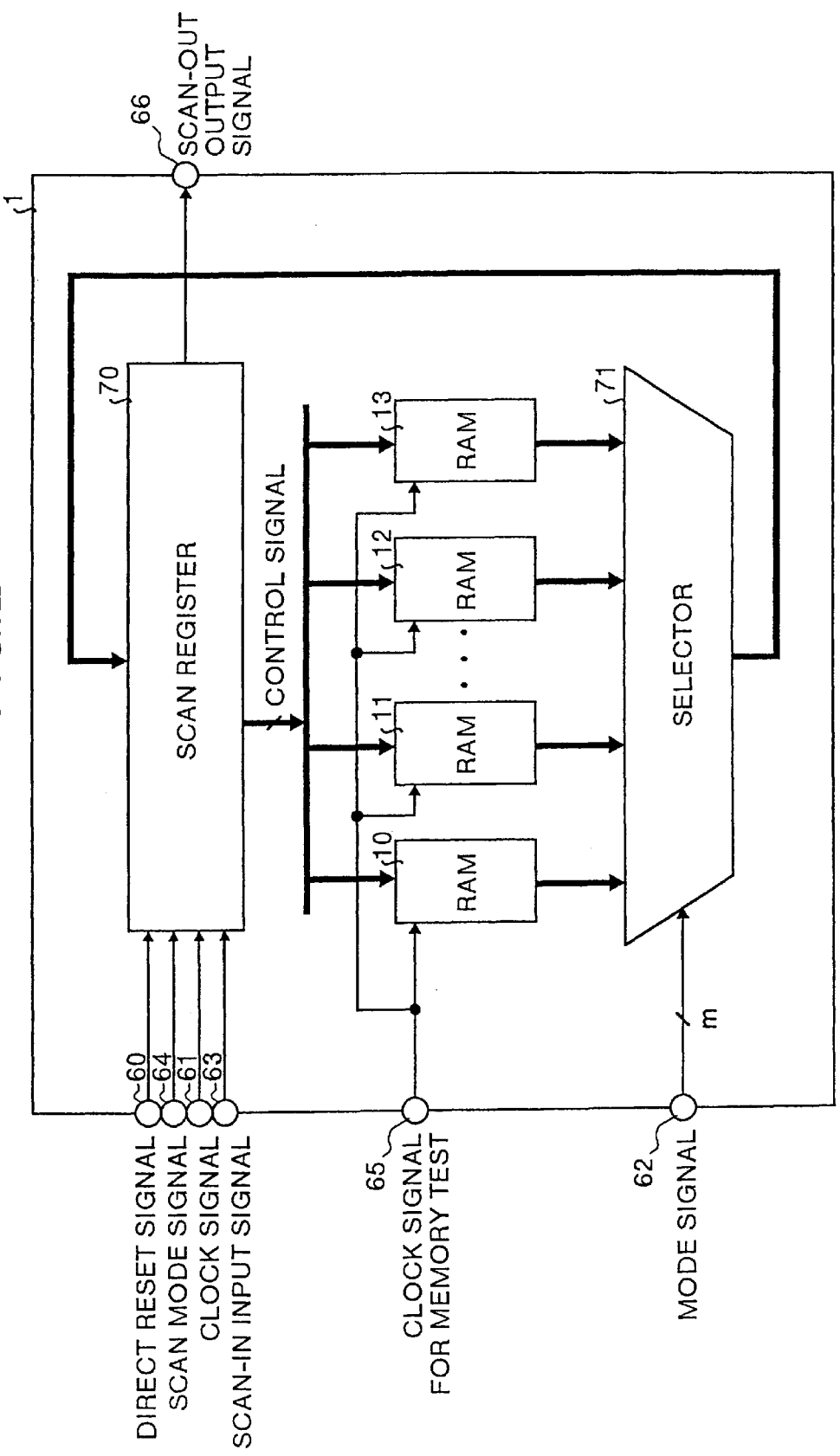
FIG. 2 is a diagram showing the constitution of the semiconductor integrated circuit according to the first embodiment when a scan control is operating in a test/repair control logic.

When the scan mode is set, the test/repair control logic 2 operates a scan control, enabling a scan test of an individual RAM to be carried out. FIG. 2 shows the constitution (equivalent circuit) of the LSI 1 when the test/repair control logic 2 is operating a scan control according to the first embodiment. In this case, in the LSI 1, a scan register 70 in the scan control extracts a direct reset signal, a scan mode signal, a clock signal and a scan data input signal, and outputs a control signal for scan test to the RAMs 10 to 13.

A clock signal for memory test is supplied to the RAMs 10 to 13. A selector 71 in the scan control extracts the RAM data output signals from the RAMs 10 to 13, selects the signal from the RAM which has been specified by the mode signal and outputs it to a scan register 70. The scan register 70 outputs this signal as a scan data output signal to the outside via the scan-out output terminal 66.

Figure 3:
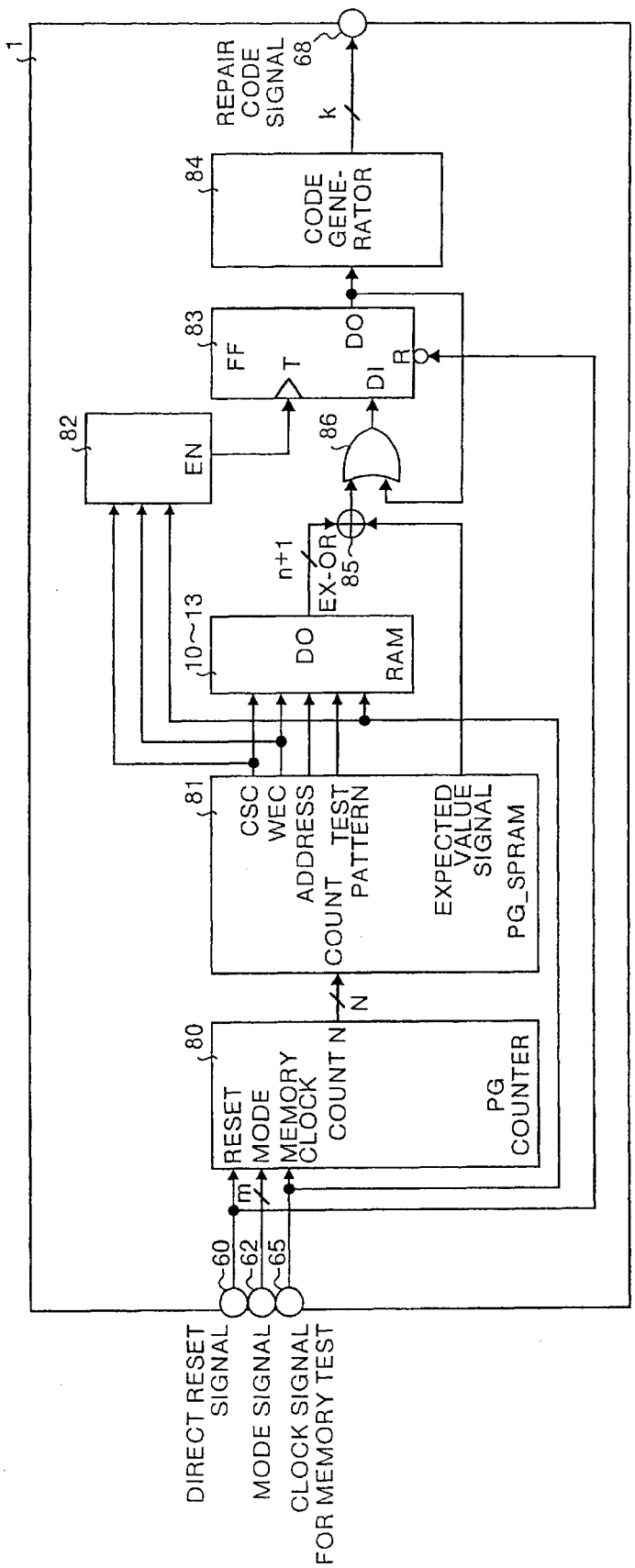
FIG. 3 is a diagram showing the constitution of the semiconductor integrated circuit according to the first embodiment when a BIST block is operating in a test/repair control logic.

When the BIST mode is set, the BIST block in the est/repair control logic 2 becomes operative and a BIST for simultaneously testing the RAMs 10 to 13 is carried out. FIG. 3 shows the constitution (equivalent circuit) of the LSI 1 when the BIST block in the test/repair control logic 2 is operating according to the first embodiment. In this case, a counter for pattern generator (PG counter) 80 in the BIST block in the LSI 1 extracts the direct reset signal, the mode signal and the clock signal for memory test, and outputs a count N output signal which forms the clock for operating the input pattern for memory test/expected value pattern creator (PG_SPRAM) 81 in the next stage.

The PG_SPRAM 81 in the BIST block extracts the count N output signal from the PG counter 80 and creates and outputs a chip select output signal (CSC output signal), a write enable output signal (WEC output signal), an address output signal, a test pattern output signal and an expected value output signal. The RAMs 10 to 13 extract the CSC output signal, the WEC output signal, the address output signal and the test pattern output signal from the PG_SPRAM 81 and the clock signal for memory test, and output a RAM data output signal.

An exclusive OR circuit (EX-OR) 85 in the BIST block extracts the expected value output signal from the PG_SPRAM 81 and the RAM data output signal from the RAMs 10 to 13, calculates an exclusive OR and outputs the result. Here, the expected value output signal matches the RAM data output signals which are output from the RAMs 10 to 13 when the RAMs 10 to 13 are operating normally. When the RAM data output signal and the expected value output signal match, the result calculated by the EX-OR 85 drops to a low logical level. That is, when the result calculated by the EX-OR 85 is at a low logical level, it can be determined that the RAM is functioning properly.

On the other hand, when the RAM data output signal and the expected value output signal do not match, the result calculated by the EX-OR 85 rises to a high logical level. That is, when the result calculated by the EX-OR 85 is at the high level, it can be determined that the RAM is defective. A logical OR circuit (OR) 86 in the BIST block extracts the result calculated by the EX-OR 85 and a DO output signal from a reset terminal flip-flop (FF) 83 in the next stage, calculates a logical OR and outputs the calculated result.

A read enable signal generator (EN) 82 in the BIST block extracts the CSC output signal and the WEC output signal from the PG_SPRAM 81 and the clock signal for memory test. The EN 82 creates a read enable signal for comparing the RAM data output signals from the RAMs 10 to 13 with the expected value output signal from the PG_SPRAM 81. The FF 83 in the BIST block extracts the read enable signal from the EN 82, the result calculated by the OR 86 and the direct reset signal, and outputs a DO signal which shows the result of the comparison between the RAM data output signals from the RAMs 10 to 13 and the expected value output signal from the PG_SPRAM 81.

A code generator 84 in the BIST block extracts the DO output signal from the FF 83 and creates and outputs a repair code signal. This repair code signal comprises a memory test completion signal, a code signal and a memory specification information signal. The memory test completion signal gives notification that the BIST test has been completed. The code signal shows one of memory assistance unnecessary (a code showing that all the RAMs 10 to 13 are functioning properly and do not need assistance), memory assistance possible (a code showing that one of the RAMs 10 to 12 had been found to be defective and can be assisted), memory assistance impossible (a code showing that one of the RAMs 10 to 12 had been found to be defective and cannot be assisted), and only memory for memory assistance defective (a code showing that only the RAM for assistance 13 has been found to be defective). The memory specification information signal shows which of the RAMs is defective.

In the above explanation of the constitution of the LSI 1, the test/repair control logics 2 and 3 and the selectors 20 to 23 and selectors 30 to 32 are conceptual functions which need not have the physical constitutions shown in the diagrams. For example, some or all of the processing functions of the test/repair control logics 2 and 3, the selectors 20 to 23 and the selectors 30 to 32 can be realized using a CPU (Central Processing Unit) which is not shown in the diagrams and by programs which are translated and executed thereby.

A computer program which issues commands to the CPU in cooperation with an OS (Operating System) or the like, thereby allowing the CPU to execute a variety of processes, is stored in a ROM not shown in the diagrams. The CPU executes the various processes in compliance with the program. Alternatively, some or all of the processing functions of the test/repair control logics 2 and 3, the selectors 20 to 23 and the selectors 30 to 32 can be realized by hardware comprising wired logic. The constituent elements of the LSI in the subsequently-described second to ninth embodiments may similarly be realized by a CPU and a program, or by hardware.

The test/repair control logics 2 and 3, the selectors 20 to 23 and the selectors 30 to 32 correspond to a first testing unit of this invention. The test/repair control logic 3, the selectors 20 to 23 and the selectors 30 to 32 correspond to a supplement control unit of this invention.

Figure 4:
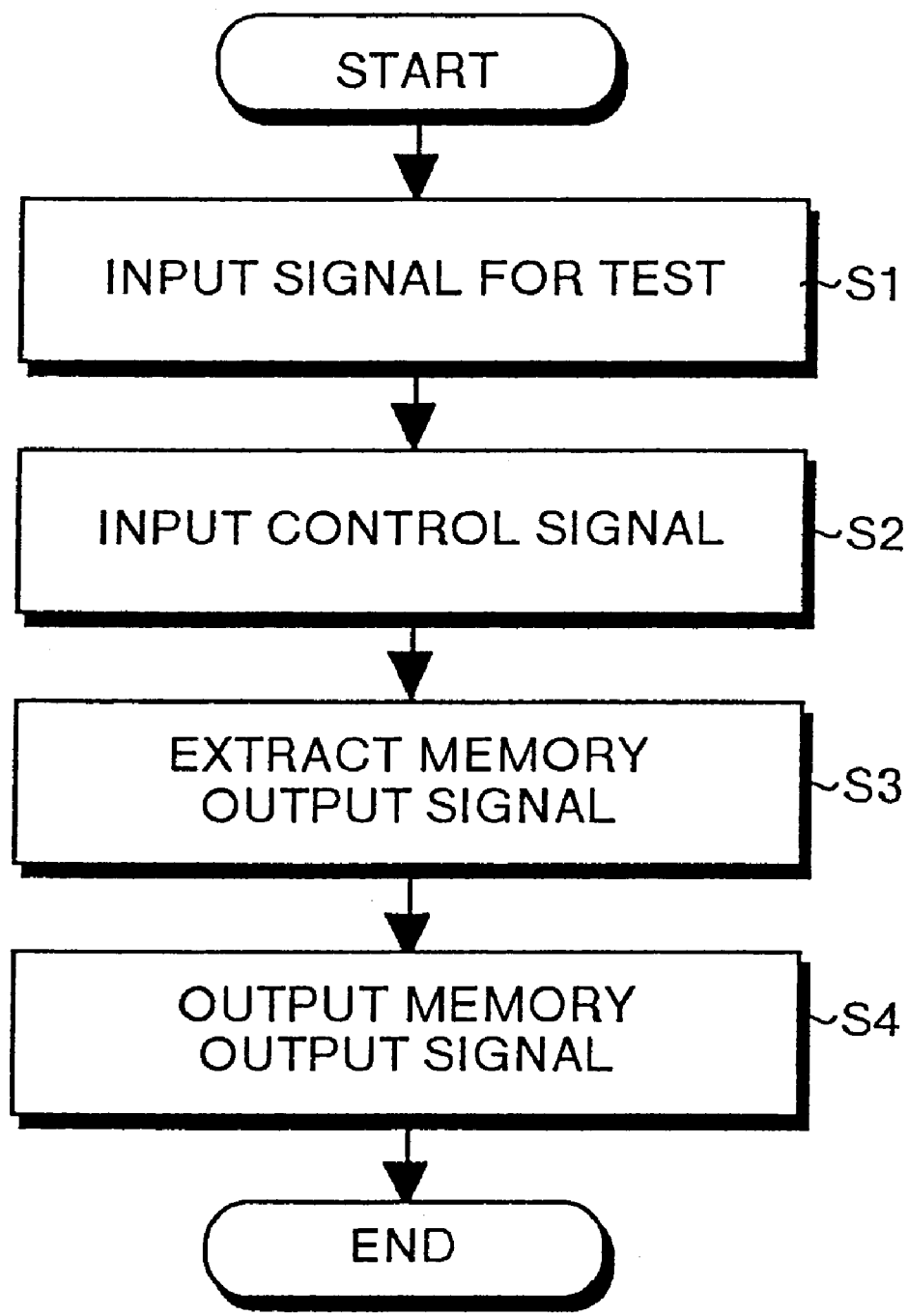
FIG. 4 is a flowchart showing the operating sequence of the scan control according to the first embodiment.

The operation of the first embodiment having the above-explained constitution will be explained while referring to the flowcharts of FIG. 4 to FIG. 6. FIG. 4 is a flowchart showing the operating sequence of the scan control of the test/repair control logic 2 according to the first embodiment. The scan control extracts a signal for test (such as a scan data input signal) from an outside apparatus for generating a signal for test (step S1). The control signal for scan test is output to the RAMs 10 to 13 (step S2). Output signals (memory output signals) are extracted from the RAMs 10 to 13 (step S3) and the memory output signal from one of the RAMs is output to an outside test apparatus (step S4).

This operation is carried out sequentially for each of the RAMs. The external test apparatus extracts each memory output signal from the LSI 1 and determines whether that particular RAM is defective. An external repair control signal generator creates a repair control signal and outputs it to the LSI 1. The repair control signal generator stores data for creating the repair control signal in accordance with the result determined by the test apparatus. For example, if the repair control signal generator has a memory for a fuse or the like, data for cutting the fuse and creating a repair control signal is stored in this memory.

Figure 5:
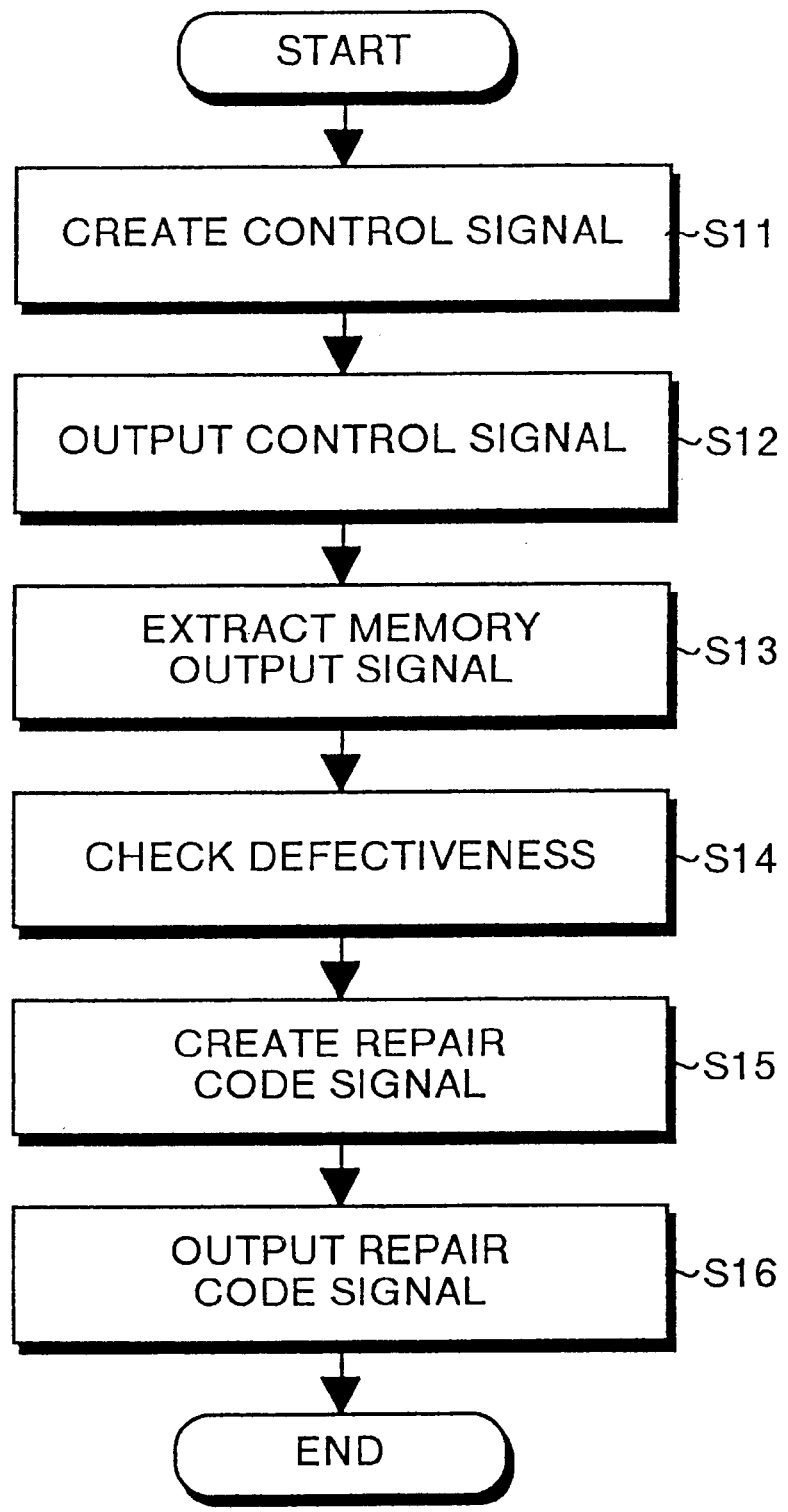
FIG. 5 is a flowchart showing the operating sequence of the BIST block according to the first embodiment.

FIG. 5 is a flowchart showing the operating sequence of the BIST block of the test/repair control logic 2 according to the first embodiment. The BIST block creates a control signal for BIST (such as a test pattern output signal) (step S11) and outputs the control signal for BIST to the RAMs 10 to 13 (step S12). The BIST block extracts the signals (memory output signals) output from the RAMs 10 to 13 (step S13) and determines whether the RAMs 10 to 13 are defective (step S14). The repair code signal is created based on the result of this determination (step S15) and is output to the outside (step S16).

This operation is carried out sequentially for each of the RAMs. The external repair control signal generator stores data for creating the repair control signal in accordance with the memory output signal from the LSI 1. For example, if the repair control signal generator has a memory for a fuse or the like, data for cutting the fuse and creating a repair control signal is stored in this memory. The repair code signal and the repair control signal may be identical.

Figure 6:
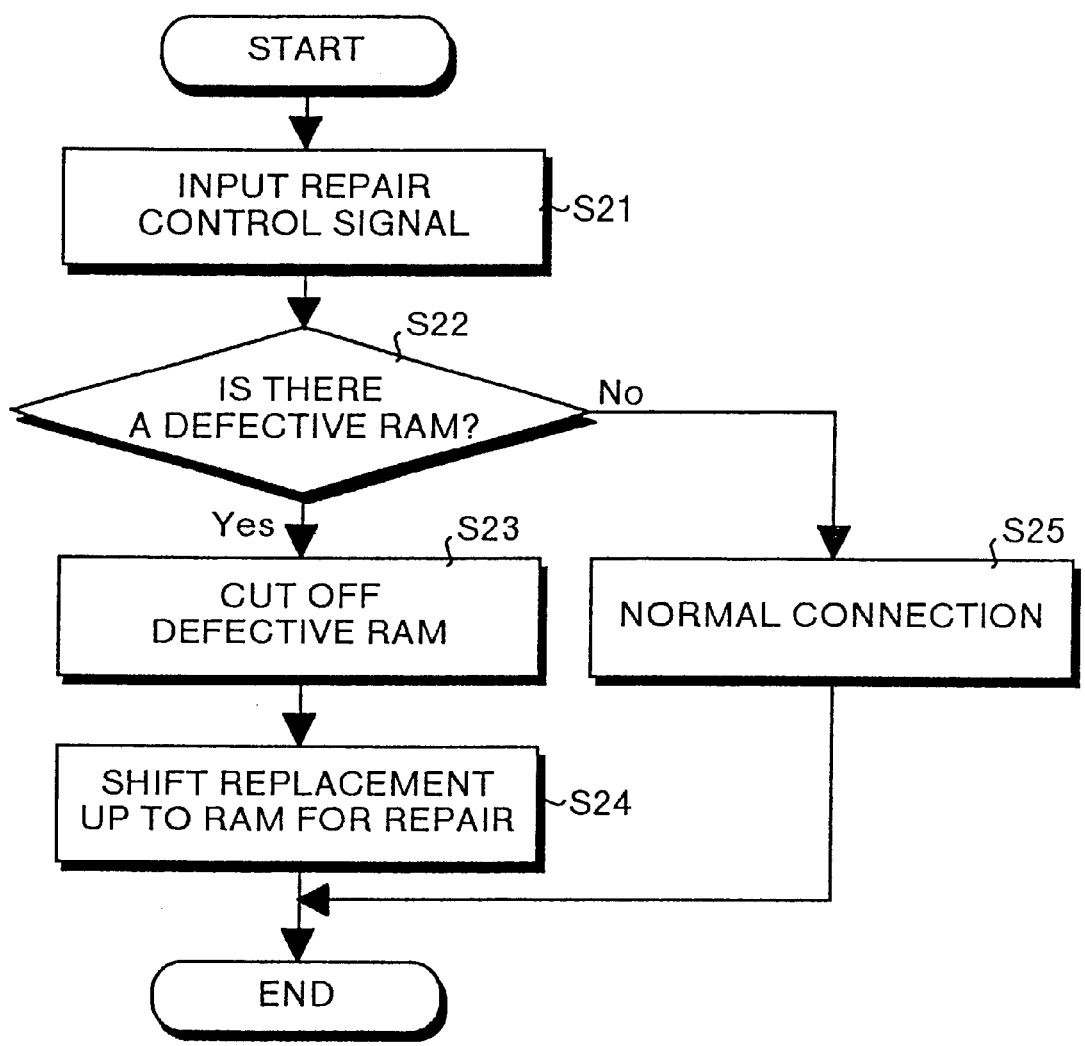
FIG. 6 is a flowchart showing the operating sequence of the test/repair control logic according to the first embodiment.

FIG. 6 is a flowchart showing the operating sequence of the test/repair control logic 3 according to the first embodiment. The test/repair control logic 3 extracts the repair control signal from the outside repair control signal generator (step S21). When no RAMs are defective (NO in step S22), the test/repair control logic 3 outputs selector selection signals for disconnecting the RAM for assistance 13 from the design block 4 to achieve normal connection to the selectors 20 to 23 and the selectors 30 to 32 (step S25). On the other hand, when there is a defective RAM, (YES in step S22), the test/repair control logic 3 outputs selector selection signals for disconnecting the defective RAM from the design block 4 and replacing it with the RAM from the RAM to the RAM for assistance 13 to the selectors 20 to 23 and the selectors 30 to 32 (steps S23 and S24).

Subsequently, the operations of the selectors 20 to 23 and the selectors 30 to 32 will be explained by way of a specific example. For example, when the RAM 11 is defective, the memory input side selector 20 corresponds to the RAM before the defective RAM 11 in the shift sequence. The selector 20 selects the signal which it would normally extract (i.e. it selects input X0). The memory input side selector 21 may select either input. The memory input side selector s subsequent to the memory input side selector 21 select the signal which would normally be selected by the immediately preceding memory input side selector in the shift sequence (i.e. they select input X1).

The memory output side selector 30 corresponds to the RAM before the defective RAM 11 in the shift sequence. The selector 30 selects the signal which it would normally extract (i.e. it selects the input X0). The memory output side selectors subsequent to the memory output side selector 30 select the signal which would normally be selected by the immediately preceding memory input side selector in the shift sequence (i.e. they select input X1). As a consequence, the input IN0 and output OUT0 of the design block 4 which normally correspond to the RAM 10 continue to correspond as normal to the RAM 10, but the input IN1 and output OUT1 of the design block 4 which normally correspond to the RAM 11 now correspond to the next RAM in the shift sequence. Thereafter, the correspondence of the selectors is shifted by one RAM, so that the final input INn and output OUTn of the design block 4 which normally correspond to the RAM 12 now correspond to the RAM for assistance 13 which is provided at the end of the shift sequence.

As described above, according to the first embodiment, the test/repair control logics 2 and 3, the selectors 20 to 23 and the selectors 30 to 32 carry out a test to detect defective RAMs among the RAMs 10 to 13, and the test/repair control logic 3, the selectors 20 to 23 and the selectors 30 to 32 replace the defective RAM with the RAM for assistance 13 based on the repair control signal in accordance with the result of the test. Consequently, the entire LSI 1 can function properly even when one of the RAMs is defective, thereby increasing the yield.

Further, according to the first embodiment, the test/repair control logic 3, the selectors 20 to 23 and the selectors 30 to 32 disconnect the RAM which has been found to be defective and replace it by shifting one or many memories from the defective RAM to the replacement RAM 13. Therefore, skews between the RAMs can be reduced. The BIST block of the test/repair control logic 2 simultaneously tests the RAMs 10 to 13 by carrying out a BIST. As a consequence, the LSI 1 can simultaneously test the memories by itself, enabling the test to be performed easily and at high speed. In addition, the test/repair control logics 2 and 3, the selectors 20 to 23 and the selectors 30 to 32 are commonly provided for many types of RAMs. Therefore, it is possible to prevent the circuit area from increasing.

Figure 7:
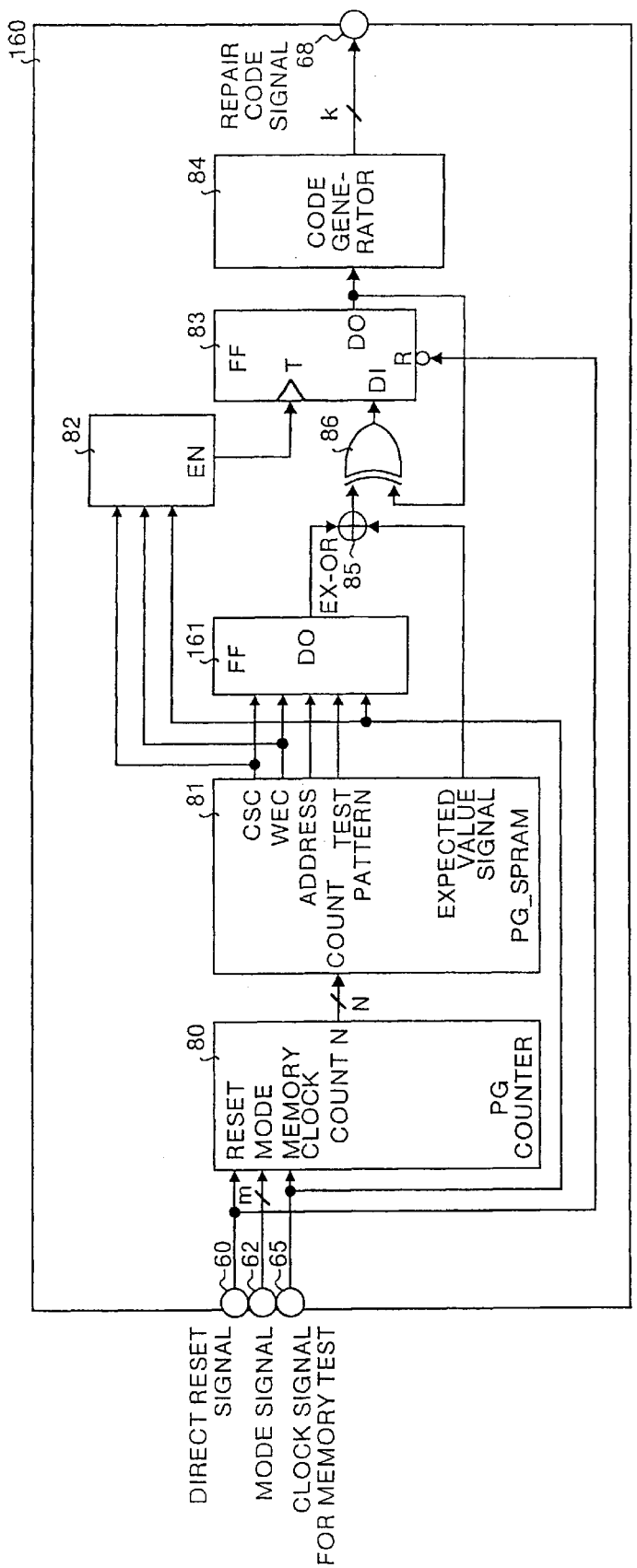
FIG. 7 is a diagram showing the constitution of the semiconductor integrated circuit according to a second embodiment of this invention when executing a test to detect a defective BIST block.

A second embodiment of this invention carries out a test to determine whether the test of the RAMs 10 to 13 in the first embodiment is properly carried out. Since the basic constitution and operation are the same as the first embodiment, only the different sections will be explained here. FIG. 7 is a diagram showing the constitution (equivalent circuit) of the LSI when a test is executed to detect a defective BIST block according to the second embodiment of this invention.

Sections which are identical to those of FIG. 3 are represented by identical legends and further explanation thereof is omitted.

In addition to the constitution of the LSI 1 of the first embodiment, the LSI 160 of the second embodiment further comprises a flip-flop (FF) for testing a memory test circuit 161 which extracts the control signal from the PG_SPRAM 81 and outputs it to the EX-OR 85 before or at the same time carrying out the BIST. Furthermore, a not shown selector selects one of, for example, the RAM data output signals from the RAMs 10 to 13 and the signal output from the FF 161 and outputting it to the EX-OR 85.

The BIST block of the second embodiment regards the flip-flop for testing a memory test circuit 161 as an artificial memory, and determines whether its own operation is regular based on reading and writing therefrom/thereto. When the test result determines that this artificial memory is defective, the BIST block determines that its own operation is not regular. The BIST block corresponds to a second testing unit of this invention.

The operation of the LSI 160 of the second embodiment will be explained with reference to the flowchart of FIG. 8.

Figure 8:
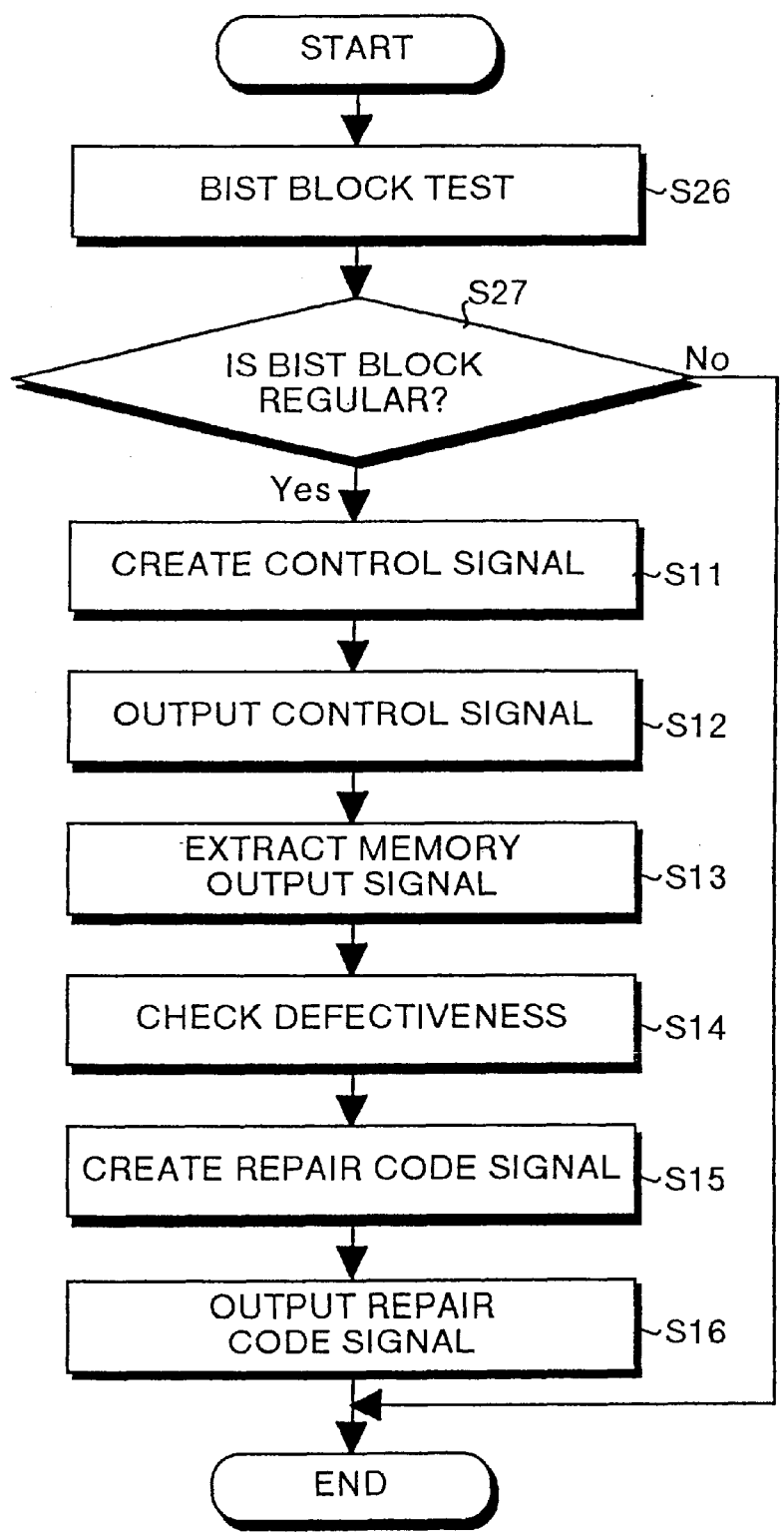
FIG. 8 is a flowchart showing the operating sequence of the BIST block according to the second embodiment.

FIG. 8 is a flowchart showing the operating sequence of the BIST block according to the second embodiment. Sections which are identical to those of FIG. 5 are represented by identical legends and further explanation thereof is omitted. Prior to executing a BIST, for example, the BIST block carries out a test to determine whether its own operation is regular (step S26). When the BIST block determines that its operation is regular (YES in step S27), the process in step S11 is performed. On the other hand, when the BIST block determines that its operation is defective (NO is step S27), the BIST block ends the processing.

According to the second embodiment, the BIST block performs a self-test to determine whether it is defective. Therefore, the reliability of the tests of the RAMs 10 to 13 carried out by the BIST block is enhanced.

Figure 9:
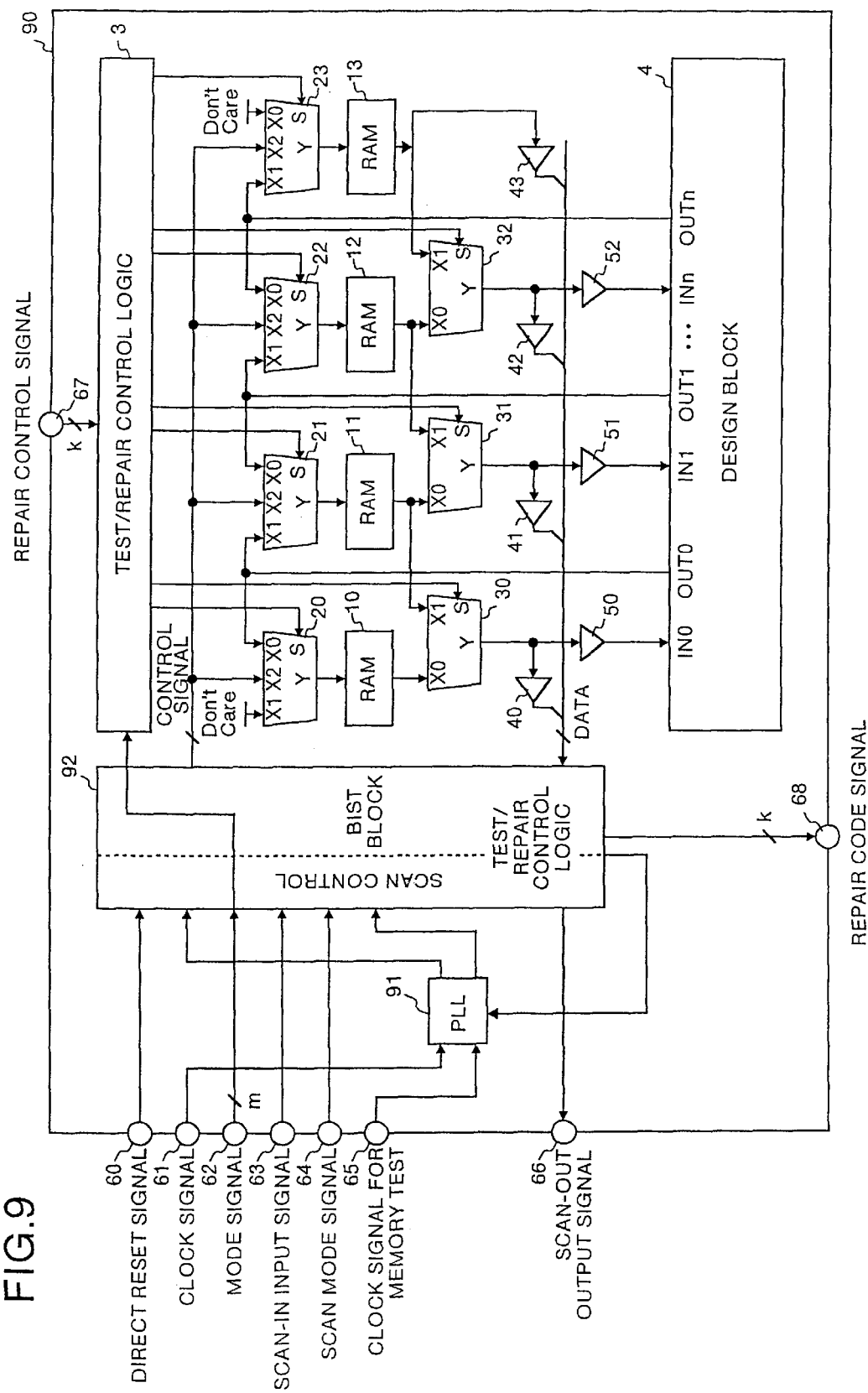
FIG. 9 is a diagram showing the constitution of a semiconductor integrated circuit according to a third embodiment of this invention.

A third embodiment of this invention uses a PLL circuit to multiply a clock signal for test and carries out an actual operation and/or speed operation margin test in the constitutions of the first and second embodiments. Since the basic constitution and operation are the same as the first and second embodiments, only the differences will be explained here. FIG. 9 is a diagram showing the constitution of the LSI according to the third embodiment of this invention. Sections which are identical to those of FIG. 1 are represented by identical legends and further explanation thereof is omitted.

In addition to the constitution of the LSI 1 of the first embodiment, the LSI 90 of the third embodiment further comprises a PLL circuit 91 which extracts a clock signal via the clock input terminal 61, extracts a clock signal for memory test via the memory clock input terminal 65, multiplies these signals and outputs them. Instead of the test/repair control logic 2 of the first embodiment, the LSI 90 comprises a test/repair control logic 92 which controls the PLL circuit 91 and extracts the clock signal and the clock signal for memory test from the PLL circuit 91.

The PLL circuit 91 multiplies and outputs the clock signal and the clock signal for memory test in compliance with the test/repair control logic 92. The test/repair control logic 92 controls the PLL circuit 91 so as to multiply the signals to the actual operating frequency. The result of multiplication of the clock signal and clock signal for memory test is input to the test/repair control logic 92, which tests the actual operation. In addition, the test/repair control logic 92 changes the frequency of the output signal of the PLL circuit 91, inputs the signal and tests the speed operation margin of the RAMs 10 to 13. The other operations and constitution of the test/repair control logic 92 are the same as the test/repair control logic 2 of the first embodiment. The PLL circuit 91 corresponds to a multiplying unit of this invention.

Figure 10:
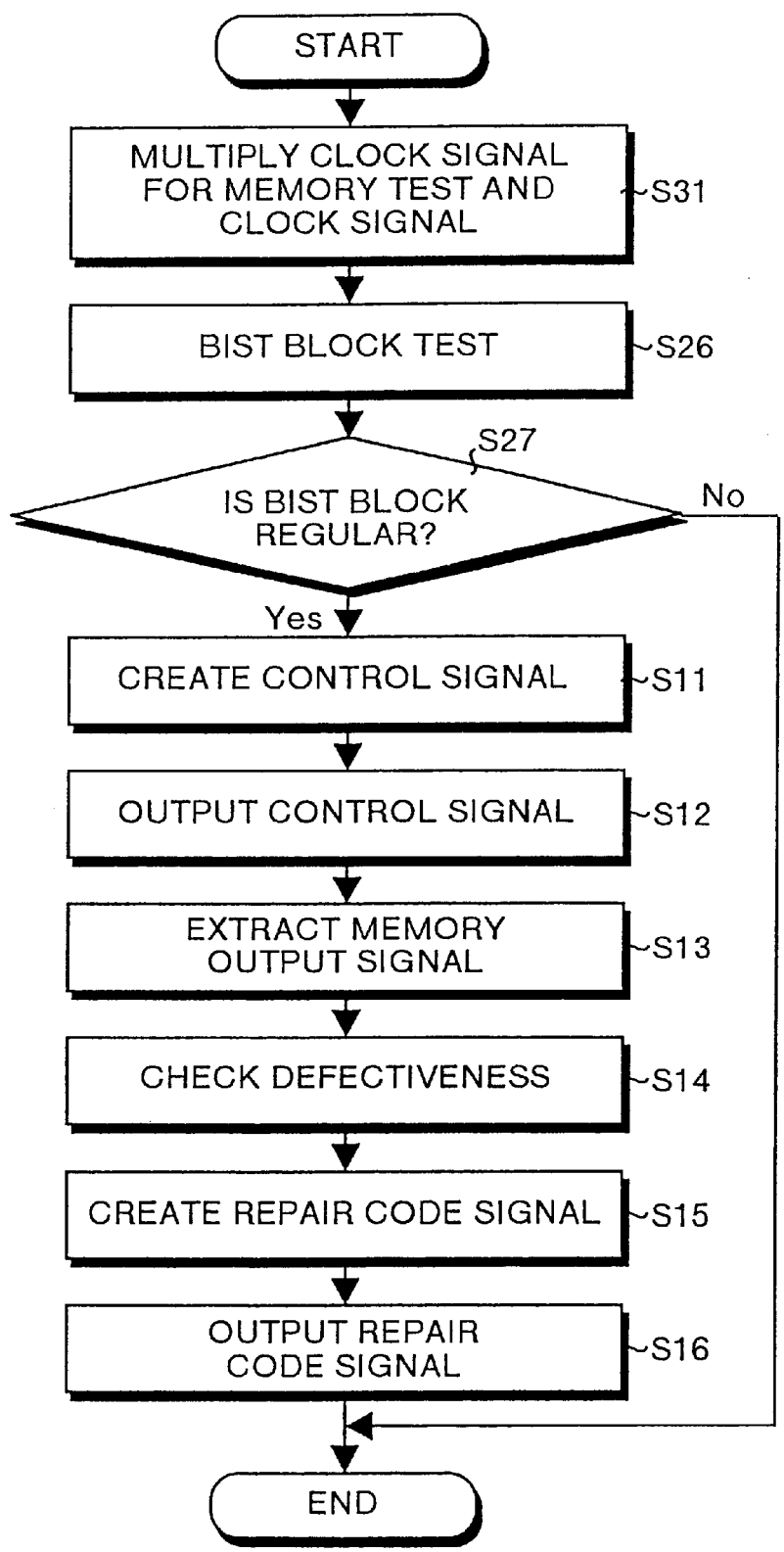
FIG. 10 is a flowchart showing the operating sequence of the BIST block according to the third embodiment.

The operation of the above constitution according to the third embodiment will be explained with reference to the flowchart of FIG. 10. FIG. 10 is a flowchart showing the operating sequence of the BIST block of the test/repair control logic 92 according to the third embodiment. Steps which are identical to those of FIG. 8 are represented by identical step numbers and further explanation thereof is omitted. When executing a BIST, the BIST block controls the PLL circuit 91 to multiply the clock signal and the clock signal for memory test to a predetermined frequency (S31), and proceeds to step S26.

As described above according to the third embodiment, the PLL circuit 91 multiplies the clock signal and the clock signal for memory test to a predetermined frequency, and the test/repair control logic 92 tests the actual operation and/or the speed operation margin by using the clock signal and the clock signal for memory test which have been multiplied by the PLL circuit 91. Therefore, a more detailed test can be carried out.

Figure 11:
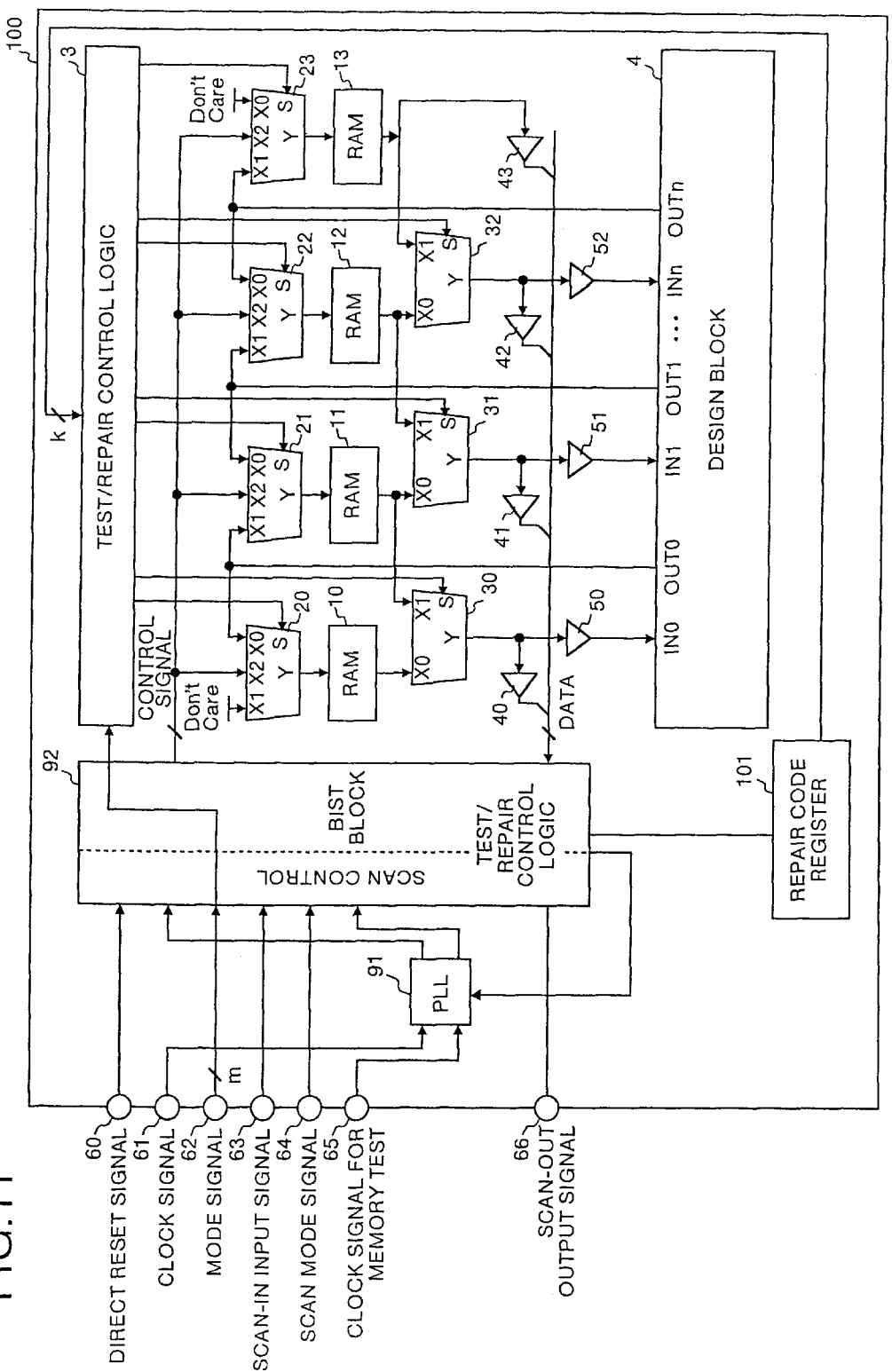
FIG. 11 is a diagram showing the constitution of a semiconductor integrated circuit according to a fourth embodiment of this invention.

A fourth embodiment of this invention stores data for creating a repair control signal in the LSI and create the repair control signal in the LSI in the first to third embodiments. Since the basic constitution and operation are the same as the first to third embodiments, only the differences will be explained here. FIG. 11 is a diagram showing the constitution of the LSI according to the fourth embodiment of this invention. Sections which are identical to those of FIG. 9 are represented by identical legends and further explanation thereof is omitted.

In addition to the constitution of the LSI 90 of the third embodiment, the LSI 100 of the fourth embodiment further comprises a repair code register 101 which creates a repair code signal. The test/repair control logic 92 inputs a repair code signal to the repair code register 101. The repair code register 101 stores data for creating a repair control signal in accordance with this repair code signal, creates the repair code signal based on this data and outputs it to the test/repair control logic 3. Consequently, there is no longer any need to provide a repair code signal generator outside the LSI 100. The repair code register 101 corresponds to a supplementary control signal creating unit of this invention.

Figure 12:
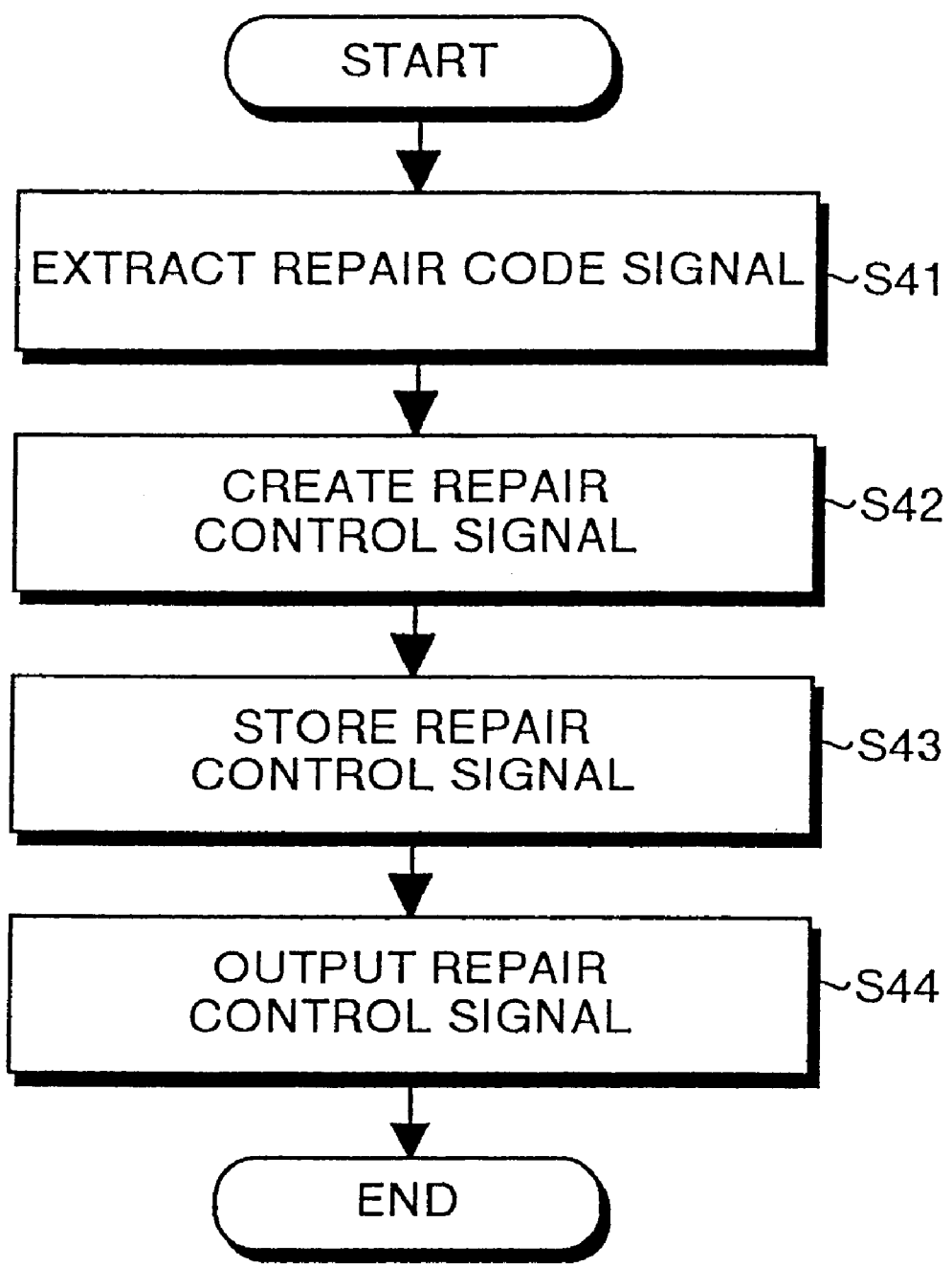
FIG. 12 is a flowchart showing the operating sequence of the test/repair control logic according to the fourth embodiment.

The operation of the above constitution according to the fourth embodiment will be explained with reference to the flowchart of FIG. 12. FIG. 12 is a flowchart showing the operating sequence of the repair code register 101 according to the fourth embodiment. During a BIST, the repair code register 101 extracts the repair code signal from the test/repair control logic 92 (step S41) and creates and stores a repair control signal (steps S42 and S43). During actual operation, the repair code register 101 outputs the stored repair control signal to the test/repair control logic 3 (step S44).

As described above according to the fourth embodiment, the repair code register 101 creates the repair control signal based on the repair code signal from the test/repair control logic 92. Therefore, the repair control signal can be created in the LSI 100.

Figure 13:
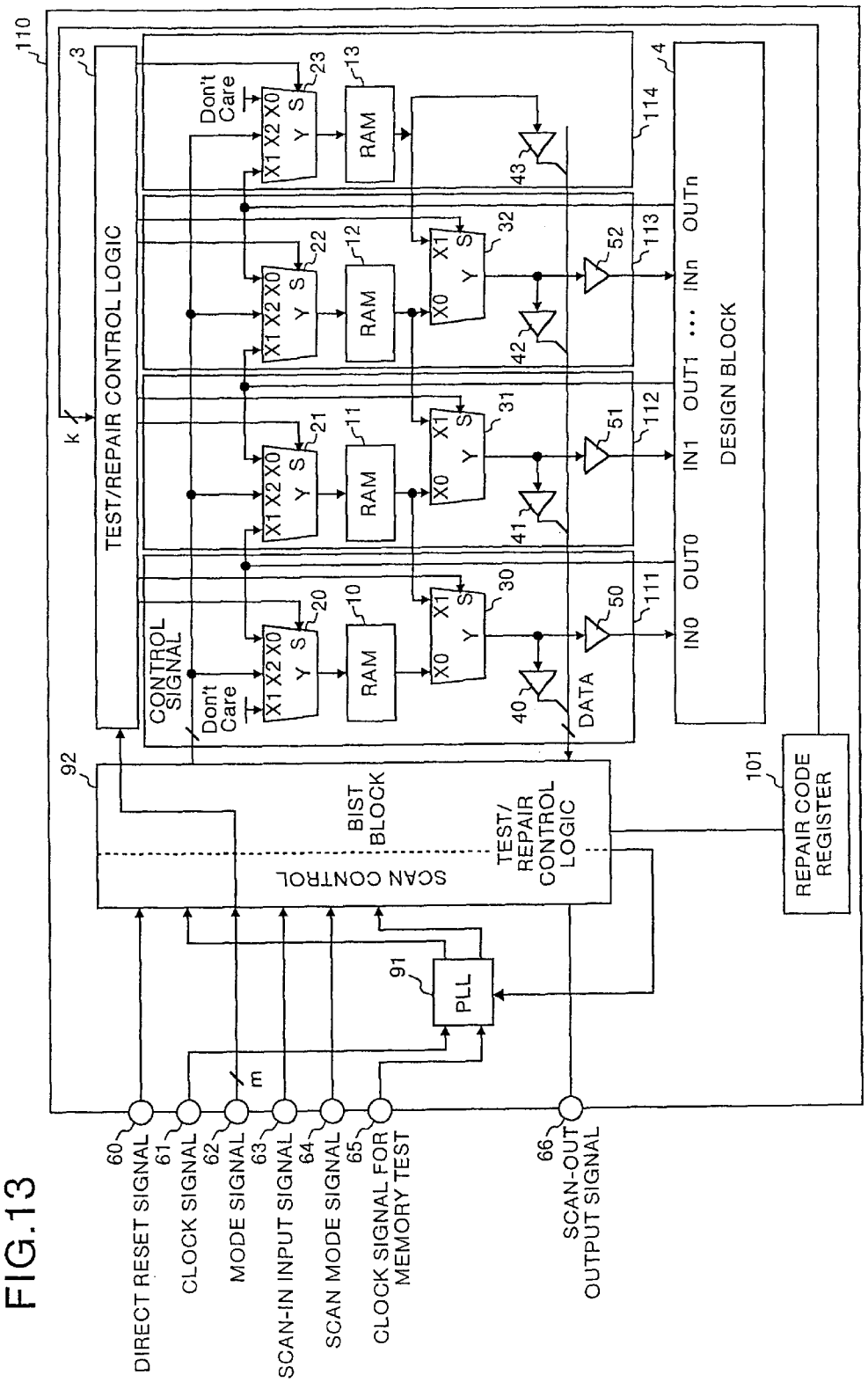
FIG. 13 is a diagram showing the constitution of a semiconductor integrated circuit according to a fifth embodiment of this invention.

In a fifth embodiment of this invention, the selectors 20 to 23 and 30 to 32 of the first to fourth embodiments are provided together with the RAMs 10 to 13. Since the basic constitution and operation are the same as the first to fourth embodiments, only the differences will be explained here. FIG. 13 is a diagram showing the constitution of the LSI according to the fifth embodiment of this invention. Sections which are identical to those of FIG. 11 are represented by identical legends and further explanation thereof is omitted.

The LSI 110 of the fifth embodiment is configured by providing selectors and buffers corresponding to the memories to memories themselves in the LSI 100 of the fourth embodiment. Legends 111, 112, 113 and 114 represent memories (regions) with built-in selectors. Thus, the selectors 20 and 30 and the buffers 40 and 50 are provided together with the RAM 10 in the memory 111. The selectors 21 and 31 and the buffers 41 and 51 are provided together with the RAM 11 in the memory 112. Similarly, the selectors 22 and 32 and the buffers 42 and 52 are provided together with the RAM 12 in the memory 113. In the memory 114, the RAM for assistance 13 is provided together with the selector 23 and the buffer 43.

As described above according to the fifth embodiment, the selectors 20 to 23 and 30 to 32 are provided in the memories 111 to 114. Therefore, skews between the memories are reduced. Furthermore, it is easy to design the constitution so as to increase memory accessing speed, and reduce the delay of signals for actual operation so as to give them priority over signals for test.

Figure 14:
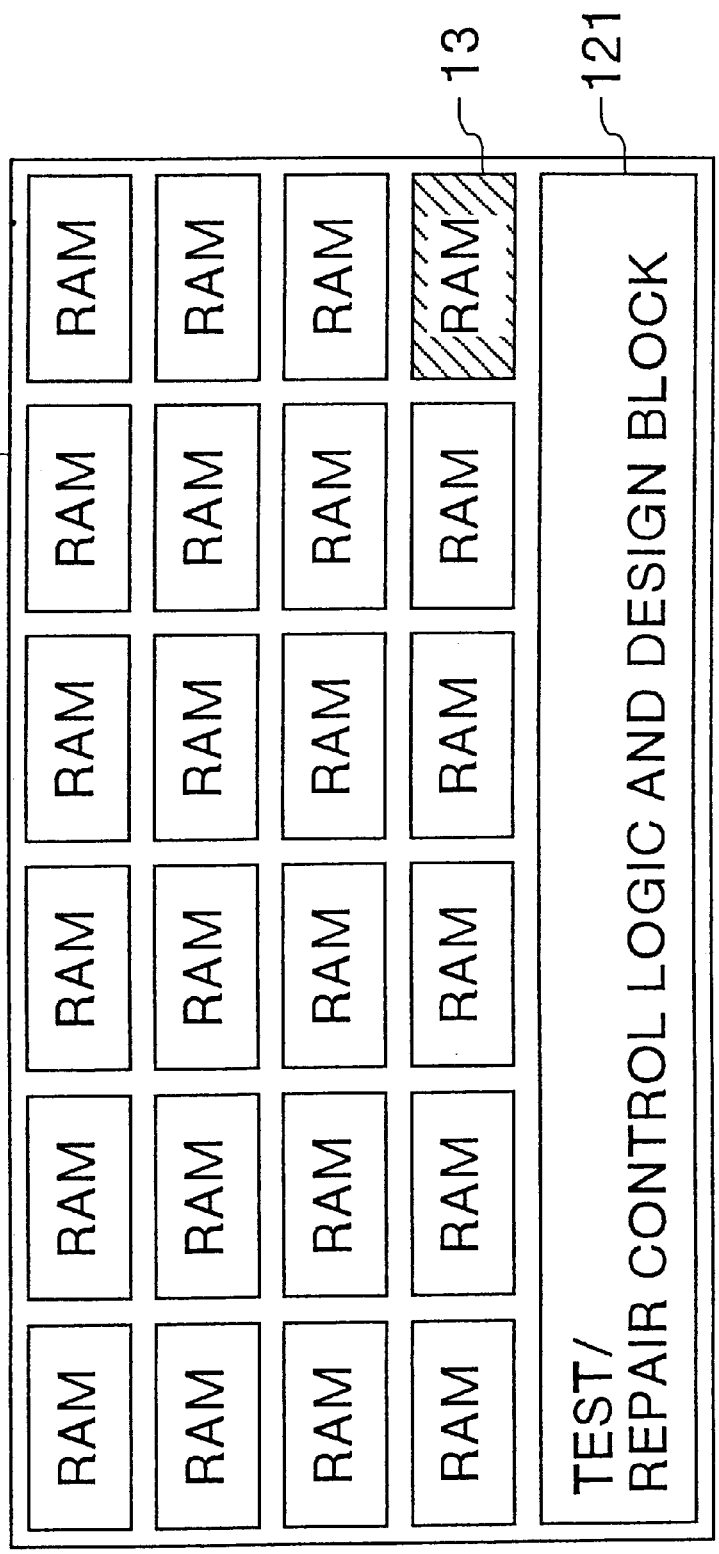
FIG. 14 is a diagram showing the constitution of a semiconductor integrated circuit according to a sixth embodiment of this invention.

In a sixth embodiment of this invention, the RAM for assistance 13 of the RAMs 10 to 13 in the first to fifth embodiments is provided physically close to the design block 4. Since the basic constitution and operation are the same as the first to fifth embodiments, only the different sections will be explained here. FIG. 14 is a diagram showing the constitution of the LSI according to the sixth embodiment of this invention.

In the LSI 120 of the sixth embodiment, the RAM for assistance 13 is provided close to a region 121 which comprises the test/repair control logic and the design block. Since the RAM for assistance 13 is provided near the design block, the timing deviates in an optimal direction when the RAM for assistance 13 is supplemented.

According to the sixth embodiment, the RAM for assistance 13 is provided on the side which is close to the region 121 comprising the test/repair control logic and the design block. Consequently, the timing deviates in an optimal direction when a RAM is replaced. Therefore, after the RAM has been replaced, the LSI 120 can function regularly at the same timing as before the replacement.

Figure 15:
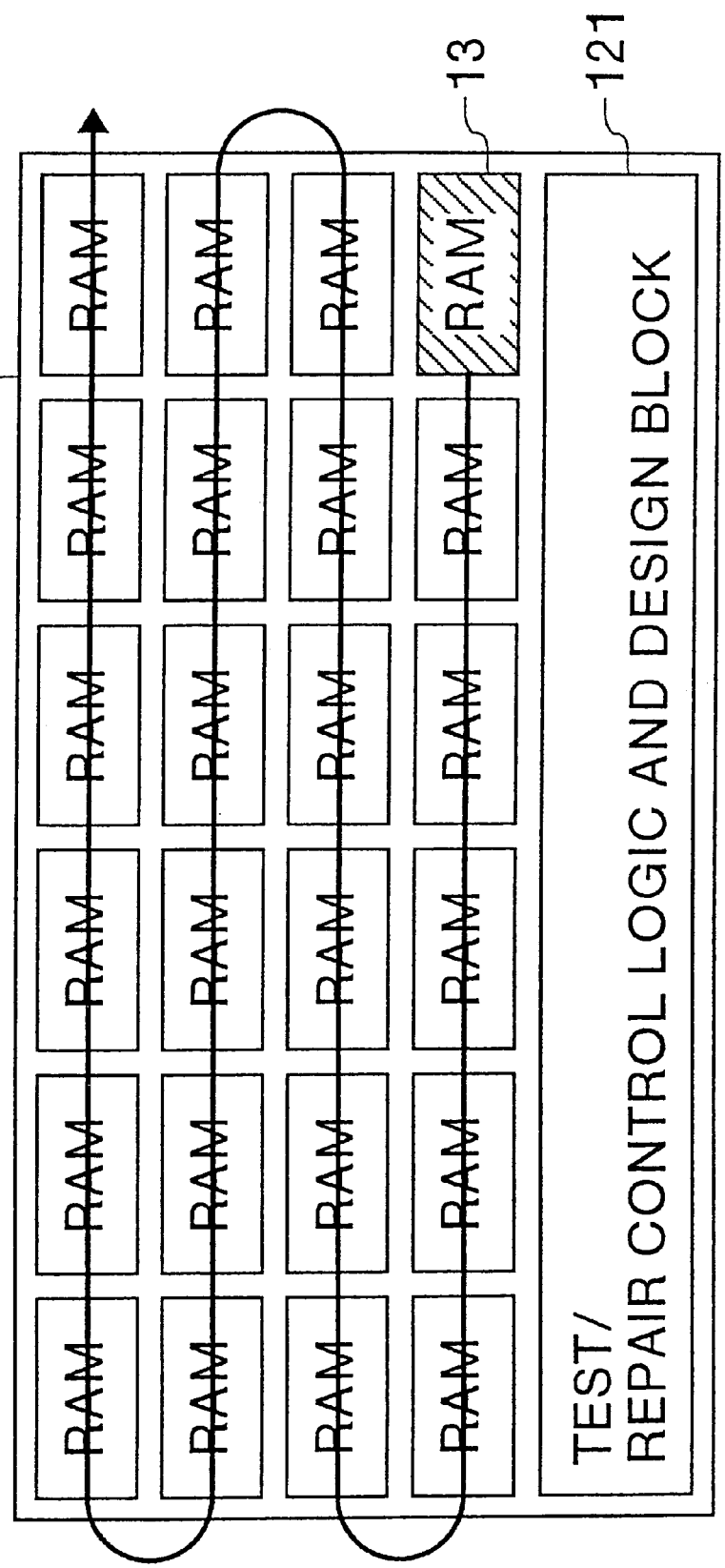
FIG. 15 is a diagram showing the constitution of a semiconductor integrated circuit according to a seventh embodiment of this invention.

In a seventh embodiment of this invention, the RAMs 10 to 13 are physically arranged in a continuous chain in correspondence with the shift sequence of the selectors 20 to 23 and 30 to 32 in the first to sixth embodiments. Since the basic constitution and operation are the same as the first to sixth embodiments, only the differences will be explained here. FIG. 15 is a diagram showing the constitution of the LSI according to the seventh embodiment of this invention. Sections which are identical to those of FIG. 14 are represented by identical legends and further explanation thereof is omitted.

In the LSI 130 of the seventh embodiment, the RAMs 10 to 13 are physically arranged in a continuous chain in correspondence with the shift sequence of the selectors 20 to 23 and 30 to 32 with the RAM for assistance 13 at the end of the chain. Since the RAMs 10 to 13 are physically arranged in a continuous chain in correspondence with the shift sequence of the selectors 20 to 23 and 30 to 32, the timing deviation when a RAM is replaced is reduced.

According to the seventh embodiment, the RAMs 10 to 13 are physically arranged in a continuous chain in correspondence with the shift sequence of the selectors 20 to 23 and 30 to 32. Therefore, skews between the RAMs can be reduced.

Figure 16:
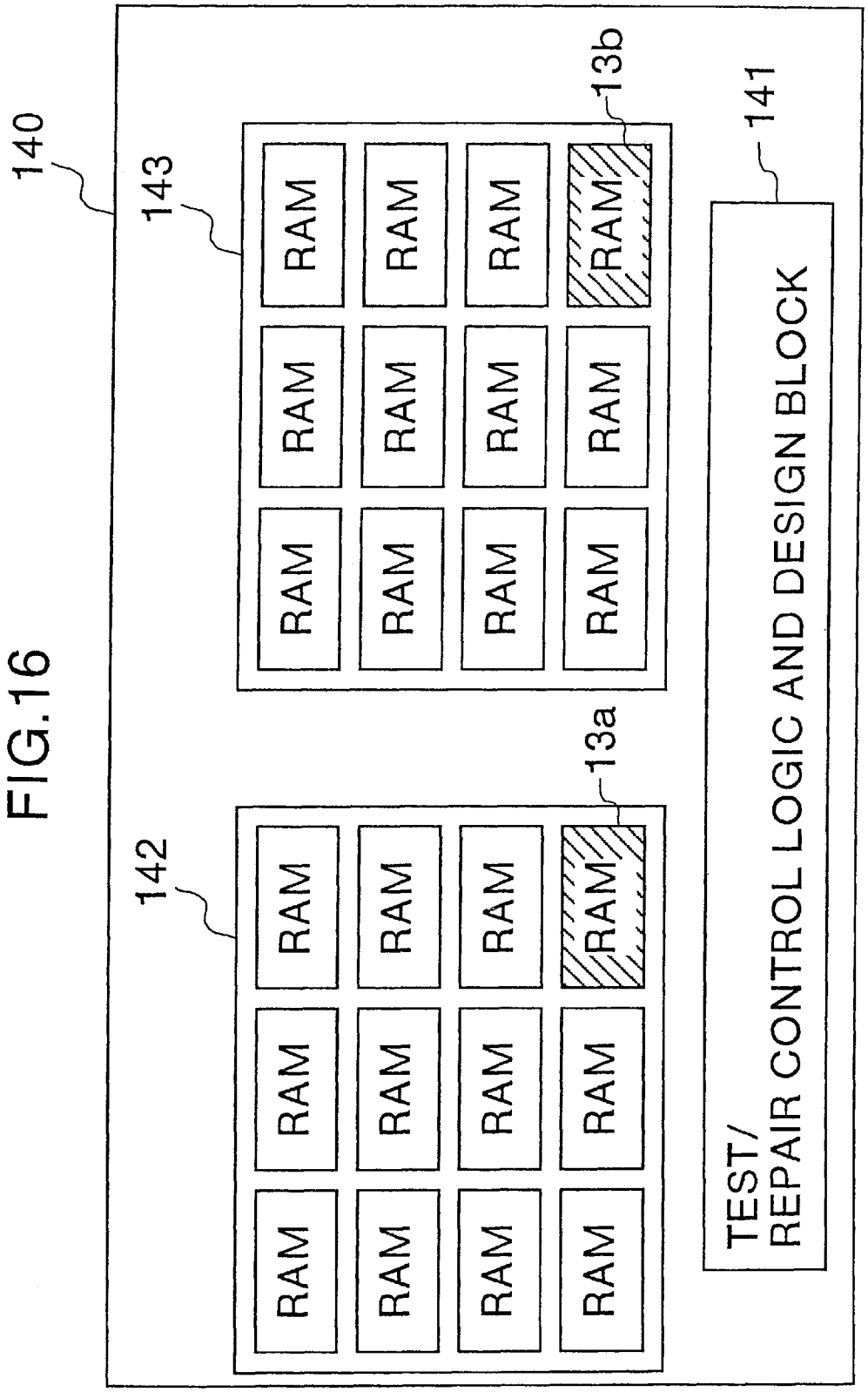
FIG. 16 is a diagram showing the constitution of a semiconductor integrated circuit according to an eighth embodiment of this invention.

In an eighth embodiment of this invention, the RAMs in the first to seventh embodiments are separated into many groups. Further, a RAM for assistance is provided in each RAM group. Since the basic constitution and operation are the same as the first to seventh embodiments, only the differences will be explained here. FIG. 16 is a diagram showing the constitution of the LSI according to the eighth embodiment of this invention.

In the LSI 140 of the eighth embodiment, the RAMs are separated into two RAM groups 142 and 143. Further, RAMs for assistance 13a and 13b are provided in the RAM groups 142 and 143 respectively. A region 141 comprises a test/repair control logic for testing and replacing the RAMs of the RAM groups 142 and 143 and a design block for achieving the functions of the LSI 140 by using the RAMs of the RAM groups 142 and 143. The RAMs for assistance 13a and 13b are used as supplements to replace defective RAMs in the RAM groups 142 and 143.

According to the eighth embodiment, the RAMs for assistance 13a and 13b are provided in each of the separately arranged RAM groups 142 and 143. Therefore, the RAM groups 142 and 143 can be repaired even in the case where the mounted RAMs are separated into the RAM groups 142 and 143. Although only two RAM groups are shown here, there could be many of them.

Figure 17:
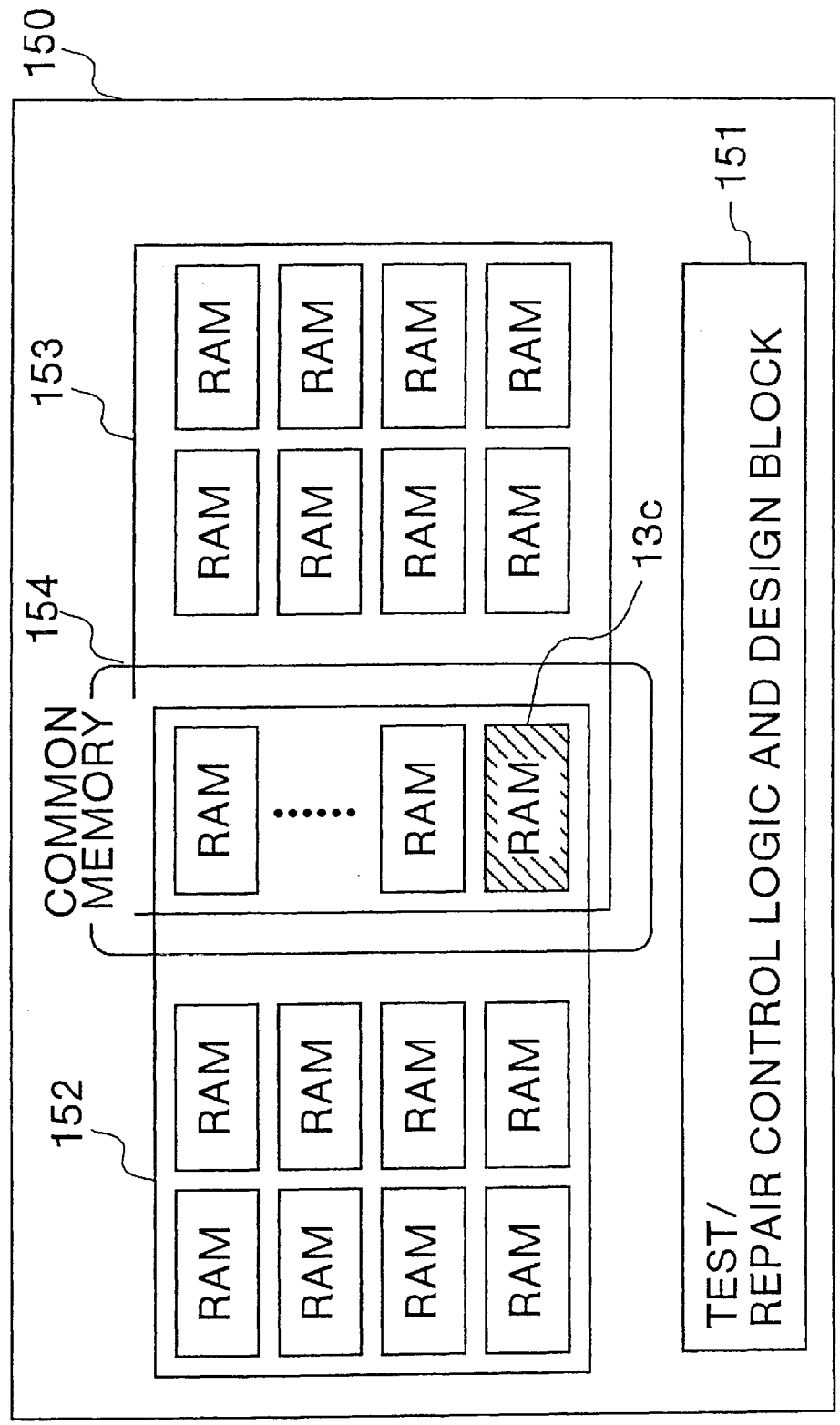
FIG. 17 is a diagram showing the constitution of a semiconductor integrated circuit according to a ninth embodiment of this invention.
Figure 18:
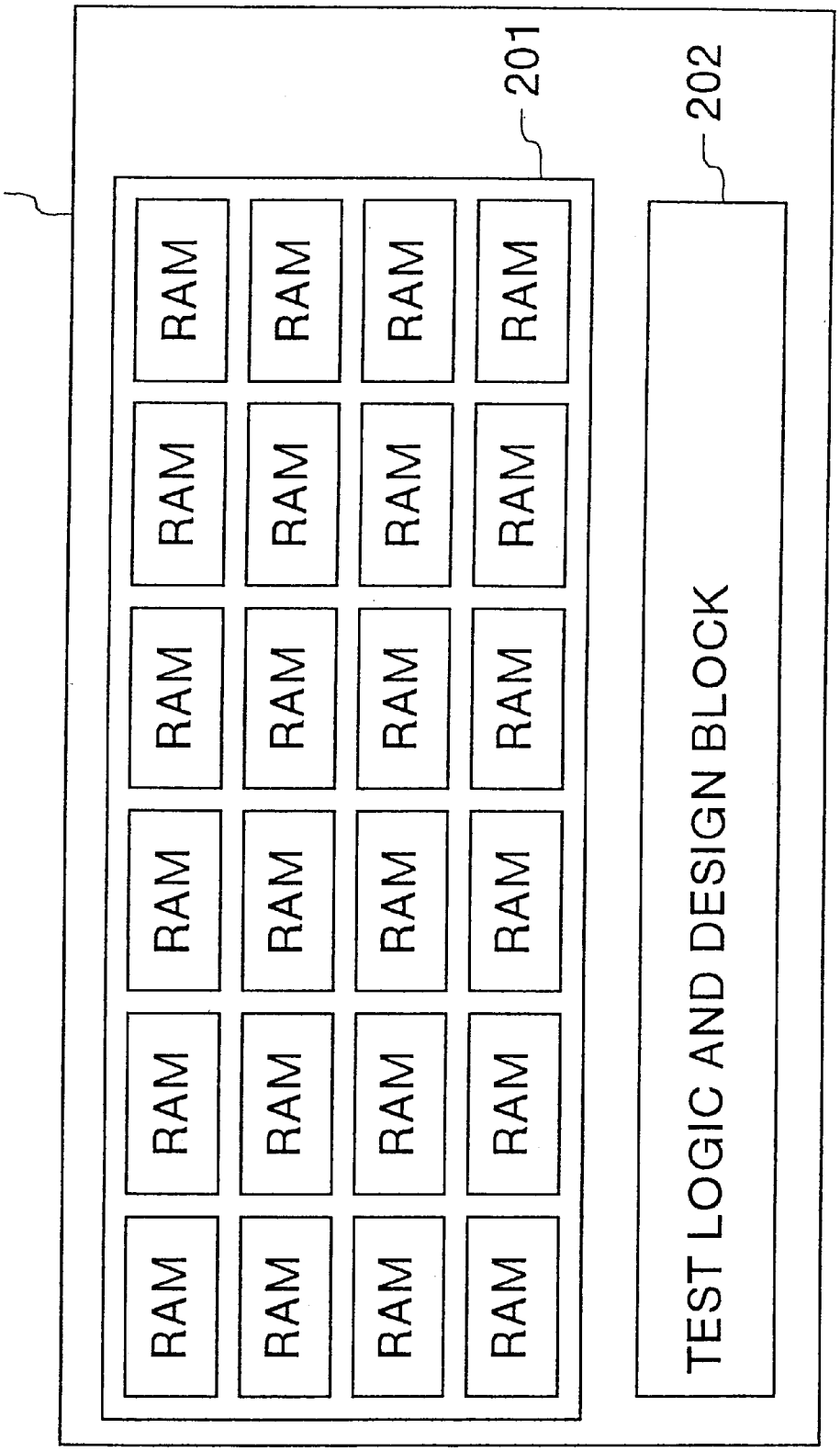
FIG. 18 is a diagram showing the constitution of a conventional semiconductor integrated circuit.

In a ninth embodiment of this invention, the mounted RAMs in the first to seventh embodiments are separately arranged in many groups, and a RAM for commonly supplementing all the RAM groups is provided. Since the basic constitution and operation are the same as the first to seventh embodiments, only the differences will be explained here. FIG. 17 is a diagram showing the constitution of the LSI according to the ninth embodiment of this invention.

In the LSI 150 of the ninth embodiment, the RAMs are separated into two RAM groups 152 and 153, and a common RAM group 154 is provided for the RAM groups 152 and 153. The common RAM group 154 comprises the common RAM for assistance 13c for the RAM groups 152 and 153. A region 151 comprises a test/repair control logic for testing and replacing the RAMs of the RAM groups 152 and 153 and the common RAM group 154 and a design block for achieving the functions of the LSI 150 by using the RAMs of the RAM groups 152 and 153 and the common RAM group 154. The RAM for assistance 13c is used as a supplement to replace defective RAMs in the RAM groups 152 and 153.

According to the ninth embodiment, a common RAM for assistance 13c is provided for the separately arranged RAM groups 152 and 153. Therefore, it is possible to prevent the scale of the circuit from increasing even in the case where the mounted RAMs are separately arranged in the RAM groups 142 and 143. Although only two RAM groups are shown here, there could be many of them.

A semiconductor integrated circuit can be provided with this memory repair function by storing a computer program for realizing the memory repair method according to the above described first to ninth embodiments in a transportable, recording medium such as a magnetic disk such as a floppy disk, a semiconductor memory (including those contained in a cartridge, a PC card, etc.) such as a ROM, an EPROM, an EEPROM, a flash ROM and the like, an optical disk such as a CD-ROM and a DVD, an optical magnetic disk such as an MO, and installing the program recorded in the recording medium into a secure recording medium such as a ROM and a RAM in the semiconductor integrated circuit.

As described above, according to the LSI of this invention, the first testing unit performs a test to detect defects among many memories, and the supplement control unit provides a supplementary memory in correspondence with the detected defective memory among the memories based on a supplement control signal which is in accordance with the result of the test performed by the first testing unit. Consequently, the entire semiconductor integrated circuit can function regularly even when any one of the memories is defective. Therefore, yield can be improved.

Furthermore, the supplement control unit shifts the memories from the stage after the detected defective memory up to the supplementary memory, whereby the detected defective memory is supplemented. Therefore, the skews between the memories can be reduced.

Furthermore, the memories are arranged continuously in correspondence with the shift performed by the supplement control unit. Therefore, the skews between the memories can be reduced.

Furthermore, the self-test control unit simultaneously tests the self-tests of the memories. Consequently, the semiconductor integrated circuit is able to simultaneously test the memories by itself. Therefore, the test can be carried out easily and at high speed.

Furthermore, the second testing unit performs a test to detect defective detection in the first testing unit. Therefore, the reliability of the test performed by the first testing unit can be increased.

Furthermore, the multiplying unit multiplies the clock signal for test of the first testing unit to a predetermined frequency, and the first testing unit tests the actual operation and/or the speed operation margin by using the clock signal which has been multiplied by the multiplying, unit. Therefore, a more detailed test can be carried out.

Furthermore, the supplement control signal creating unit automatically creates a supplement control signal based on the test result of the first testing unit. Therefore, the supplement control signal can be automatically created in the semiconductor integrated circuit.

Furthermore, the first testing unit is provided commonly for many types of memories. Therefore, an increase in the circuit area can be prevented.

Furthermore, the supplement control unit is distributed across many memories. Therefore, skews between the memories can be reduced. Furthermore, the constitution can easily be designed so as to increase memory accessing speed, and reduce the delay of signals for actual operation so as to give them priority over signals for test.

Furthermore, the supplementary memory is provided on a side close to the circuit which uses the memories. Consequently, the timing deviates in an optimal direction when a memory is replaced. Therefore, after the memory has been replaced, the semiconductor integrated circuit can function regularly at the same timing as before the replacement.

Furthermore, the supplementary memory is provided for each of multiple separately arranged memory groups Therefore, memories in each group can be repaired even in the case where the multiple memories are separately arranged in the multiple groups.

Furthermore, the supplementary memory is provided commonly for the separately arranged multiple memory groups. Therefore, it is possible to prevent the circuit area from increasing.

According to the method of this invention, the first testing step performs a test to detect defects among multiple memories, and the supplement control step provides a supplementary memory in correspondence with the detected defective memory among the multiple memories based on a supplement control signal which is in accordance with the result of the test performed by the first testing step. Consequently, the entire semiconductor integrated circuit can function regularly even when any one of the memories is defective. Therefore, yield can be improved.

Furthermore, the supplement control step shifts the memories from the stage after the detected defective memory up to the supplementary memory, whereby the detected defective memory is supplemented. Therefore, the skews between the memories can be reduced.

Furthermore, the self-test control step simultaneously tests the self-tests of the multiple memories at the first testing step. Consequently, the semiconductor integrated circuit is able to simultaneously test the multiple memories by itself. Therefore, the test can be carried out easily and at high speed.

Furthermore, the second testing step per forms a test to detect defective detection in the first testing step. Therefore, the reliability of the test performed by the first testing step can be increased.

Furthermore, the multiplying step multiplies the clock signal for test of the first testing step to a predetermined frequency, and the first testing step tests the actual operation and/or the speed operation margin by using the clock signal which has been multiplied by the multiplying step. Therefore, a more detailed test can be carried out.

According to the computer product of this invention, a computer-readable recording medium which programs for allowing a computer to execute the memory repair method of a semiconductor integrated circuit according to the invention as described above are stored in. Therefore, the operations and methods of the invention described above can be realized by a computer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
   a plurality of memories;
   a supplementary memory different from said plurality of memories;
   a first testing unit which performs a first test with respect to each of said plurality of memories to detect whether any of said plurality of memories is defective; and
   a supplement control unit which receives a test result of the first test carried out by said first testing unit, and if the test result shows that there is a defective memory in said plurality of memories, replaces the defective memory with said supplementary memory based on a supplement control signal.

2. The semiconductor integrated circuit according to claim 1, wherein
   said plurality of memories are set in a shift order, said supplementary memory being set in a last stage of the shift order; and
   said supplement control unit carries out a shift from a subsequent stage of said defective memory to said supplementary memory, thereby supplementing said defective memory.

3. The semiconductor integrated circuit according to claim 2, wherein said plurality of memories are provided continuously and in correspondence with the shift order of said supplement control unit.

4. The semiconductor integrated circuit according to claim 1, wherein said first testing unit comprises a self-test control unit which simultaneously controls self-tests of said plurality of memories.

5. The semiconductor integrated circuit according to claim 1, further comprising a second testing unit which performs a second test to detect defective detection by said first testing unit.

6. The semiconductor integrated circuit according to claim 1, further comprising a multiplying unit which multiplies a clock signal for test of said first testing unit at a multiplied frequency, and wherein said first testing unit tests at least one of actual operation and speed operation margin using the multiplied clock signal produced by said multiplying unit.

7. The semiconductor integrated circuit according to claim 1, further comprising a supplement control signal creating unit which automatically creates said supplement control signal based on the test result of said first testing unit.

8. The semiconductor integrated circuit according to claim 1, wherein said plurality of memories comprises multiple memory types, and said first testing unit commonly test said plurality of memories.

9. The semiconductor integrated circuit according to claim 1, wherein said supplement control unit is distributed across said plurality of memories.

10. The semiconductor integrated circuit according to claim 1, further comprising a memory using circuit which uses said plurality of memories and said supplementary memory is on a side close to said memory using circuit.

11. The semiconductor integrated circuit according to claim 1, wherein said plurality of memories are separately arranged in a plurality of groups, and including a said supplementary memory for each of said plurality of memory groups.

12. The semiconductor integrated circuit according to claim 1, wherein said plurality of memories are separately arranged in a plurality of groups, and said supplementary memory is provided commonly for said plurality of memory groups.

13. A method of memory repair for a semiconductor integrated circuit comprising a plurality of memories and a supplementary memory, comprising performing a first test to detect a defective memory among said plurality of memories; and supplementing with said supplementary memory said defective memory detected among said plurality of memories based on a supplement control signal in accordance with a result of the first test.

14. The method of memory repair for a semiconductor integrated circuit according to claim 13, wherein said plurality of memories are set in a shift order, said supplementary memory is set as a last stage of the shift order, and including shifting said defective memory to said supplementary memory, thereby supplementing said defective memory.

15. The method of memory repair for a semiconductor integrated circuit according to claim 13, further comprising controlling said plurality of memories to perform simultaneous self-tests as the first test.

16. The method of memory repair for a semiconductor integrated circuit according to claim 13, further comprising performing a second test to detect defective detection in the first test.

17. The method of memory repair for a semiconductor integrated circuit according to claim 13, further comprising multiplying a clock signal for testing of the first test to a multiplied frequency, the first test testing one of actual operation and speed operation margin using the multiplied clock signal in said.

18. A computer readable medium storing instructions which, when executed by a computer, cause the computer to:

perform a test to detect a defective memory among a plurality of memories; and supplement with a supplementary memory said defective memory detected among said plurality of memories based on a supplement control signal in accordance with a result of the test.

* * * * *